United States Patent
Takaishi

[19]

[11] Patent Number: 6,078,105
[45] Date of Patent: *Jun. 20, 2000

[54] METHOD FOR MANUFACTURING SEMICONDUCTOR DEVICE USING SPIN ON GLASS LAYER

[75] Inventor: Yoshihiro Takaishi, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/002,862

[22] Filed: Jan. 5, 1998

Related U.S. Application Data

[62] Division of application No. 08/843,044, Apr. 11, 1997, Pat. No. 5,913,150.

[51] Int. Cl.[7] .......... H01L 21/321; H01L 23/535
[52] U.S. Cl. .......... 257/750; 257/758; 257/760; 257/306
[58] Field of Search .................. 257/750, 760, 257/758, 306

[56] References Cited

U.S. PATENT DOCUMENTS

| 5,117,273 | 5/1992 | Stark et al. | 357/54 |
| 5,479,054 | 12/1995 | Tottori | 257/760 |

FOREIGN PATENT DOCUMENTS

| 3006827 | 1/1991 | Japan | 257/758 |
| 4369853 | 12/1992 | Japan . | |
| 7-74248 | 3/1995 | Japan . | |
| 2251722 | 7/1992 | United Kingdom | 257/760 |

*Primary Examiner*—Leo P. Picard
*Assistant Examiner*—Hung Van Duong
*Attorney, Agent, or Firm*—Sughrue, Mion, Zinn, Macpeak & Seas, PLLC

[57] ABSTRACT

In a method for manufacturing a semiconductor device, a dummy pattern layer is formed on a layer which is located below an insulating layer on which a spin on glass (SOG) layer is formed. The insulating layer is flattened by etching back the SOG layer. Then, a contact hole is perforated in the insulating layer, the dummy pattern layer and the layer, and a conductive layer is buried in the contact hole.

10 Claims, 33 Drawing Sheets

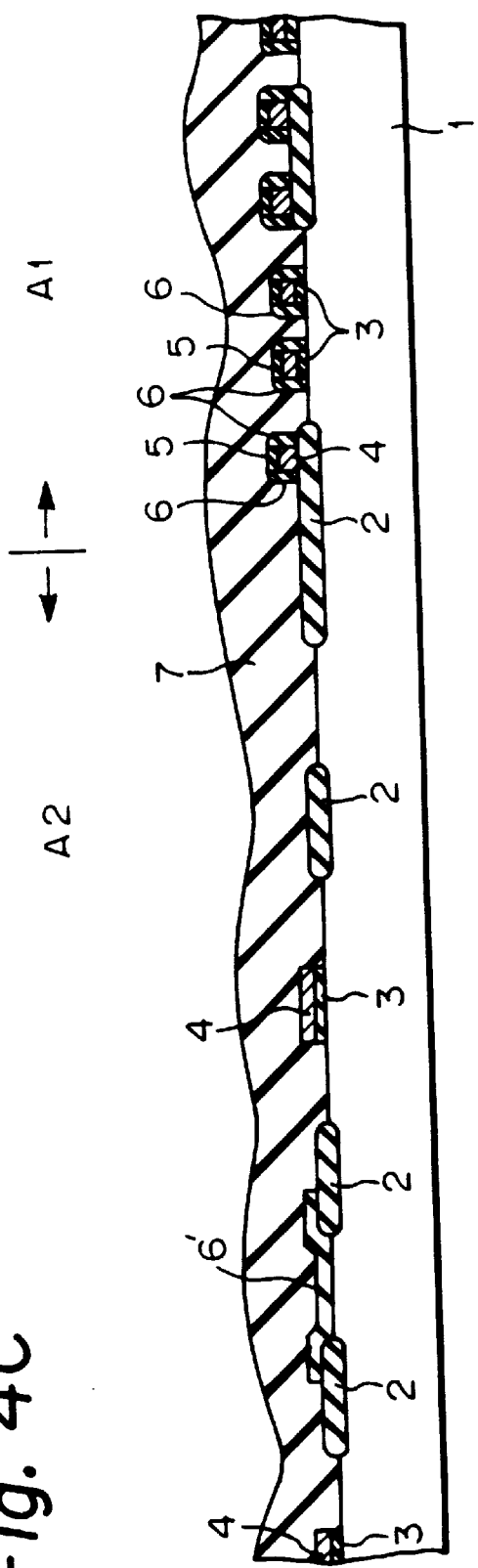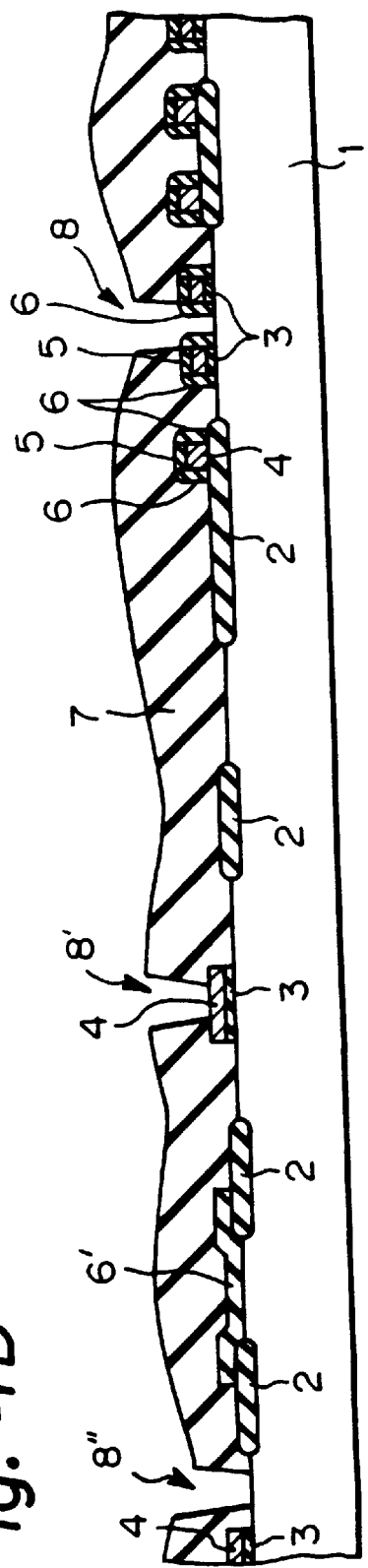

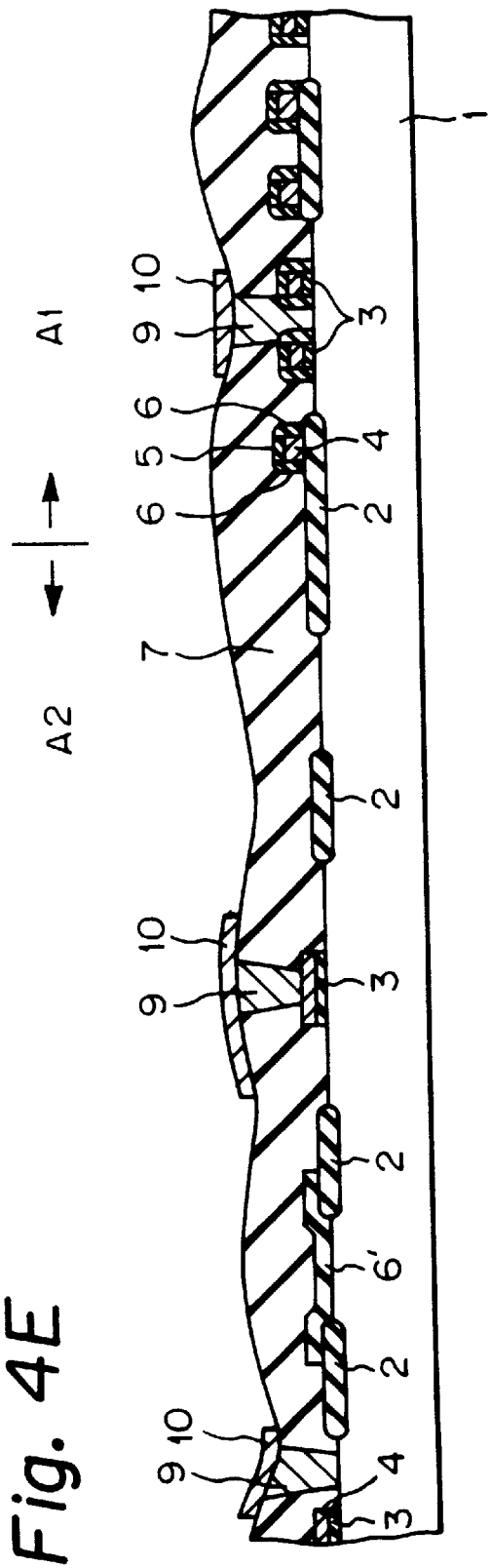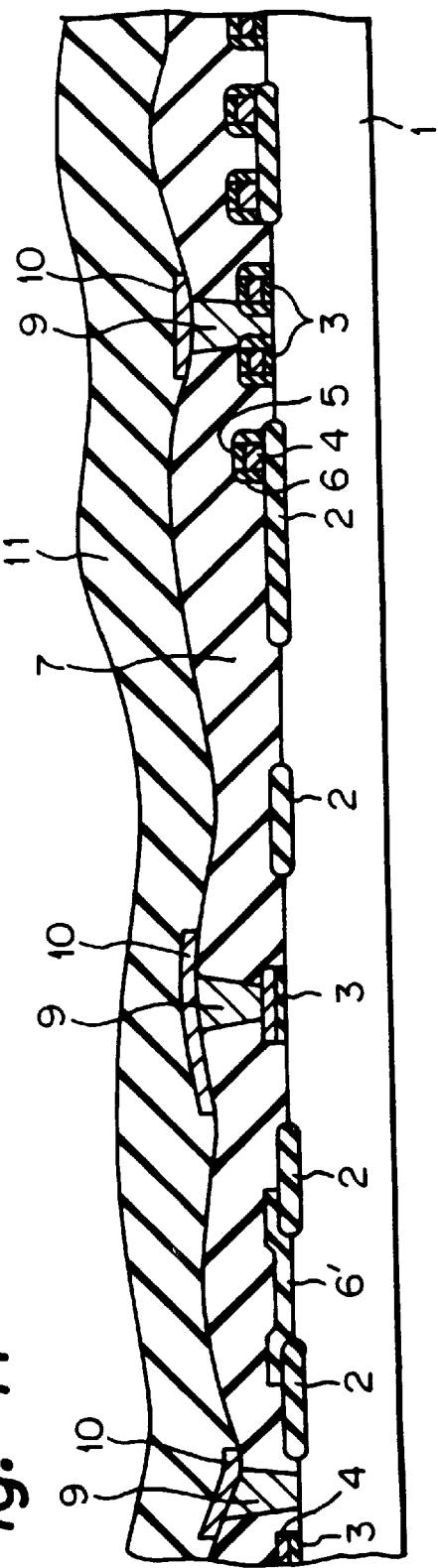

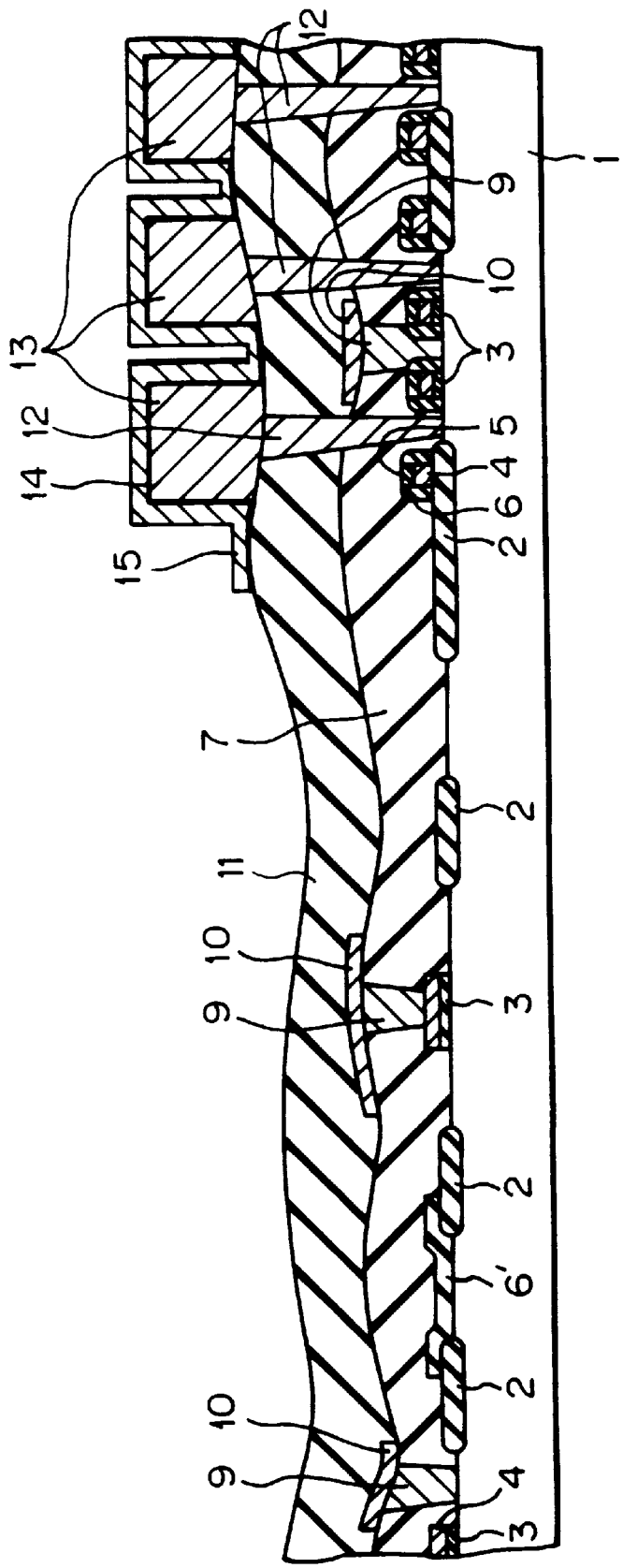

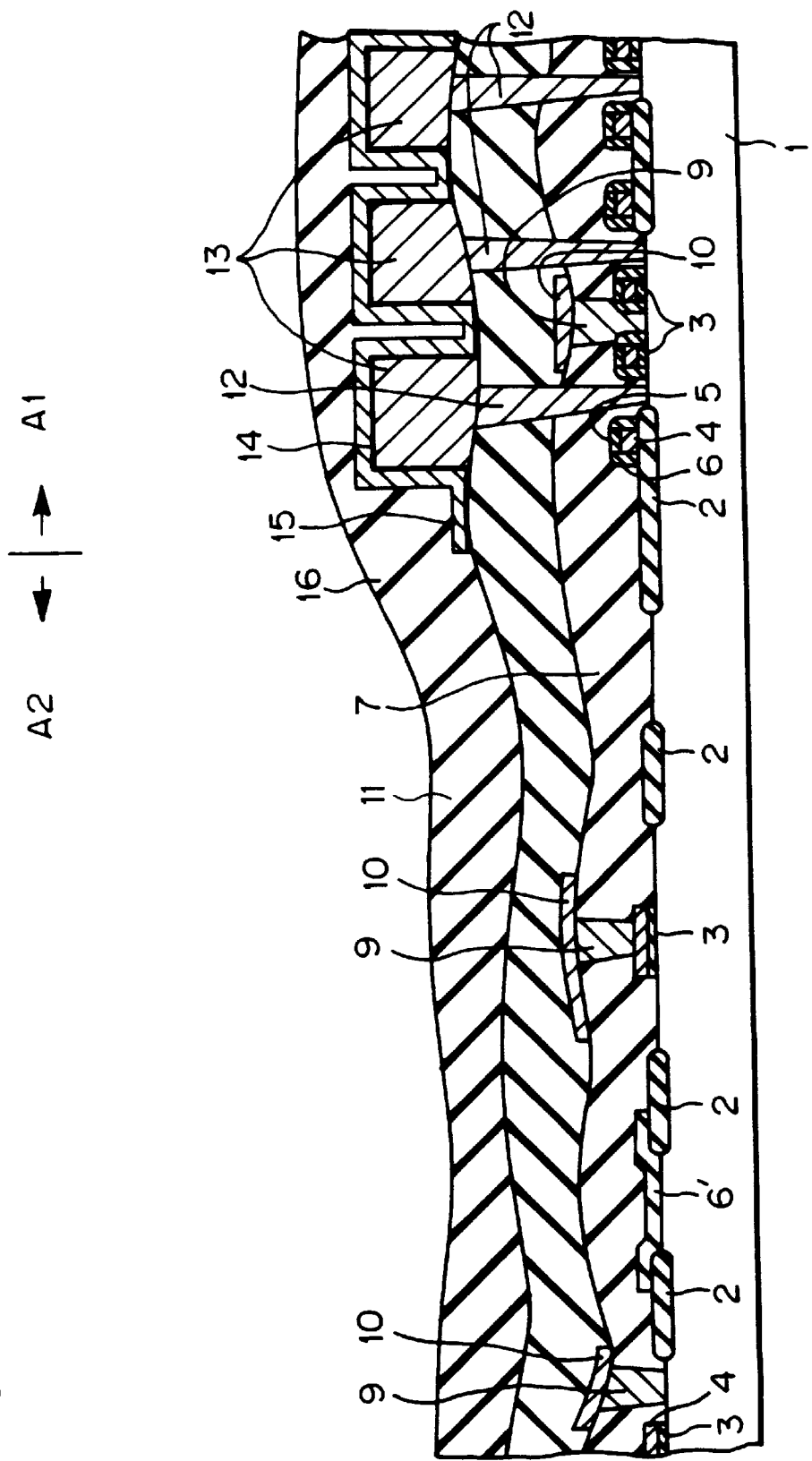

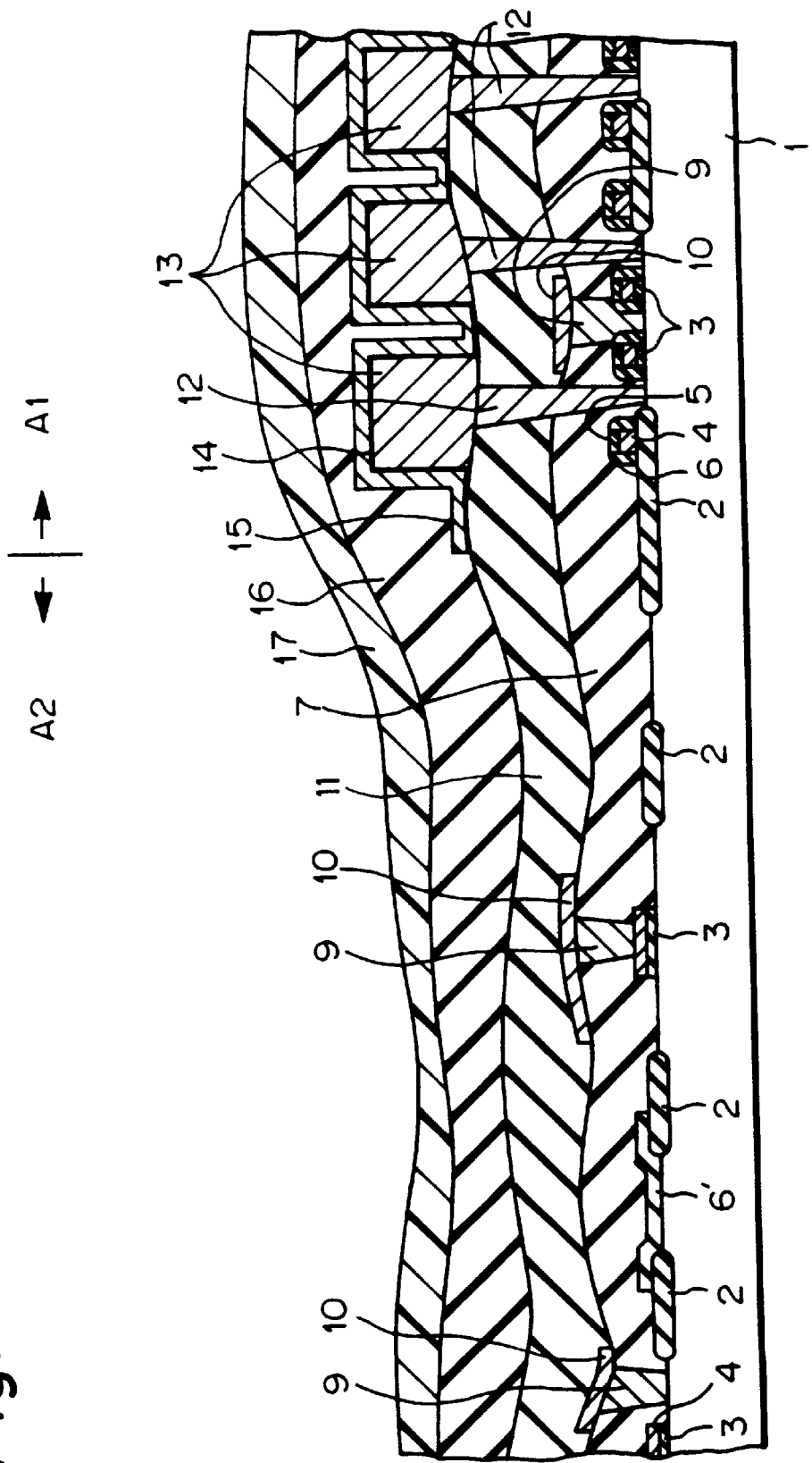

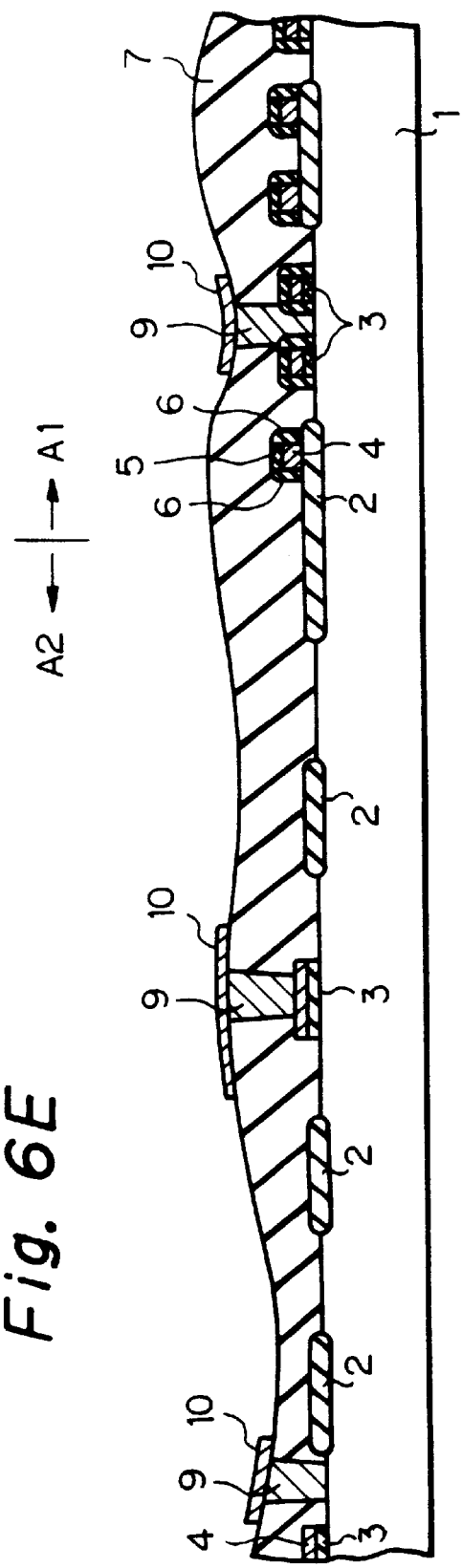
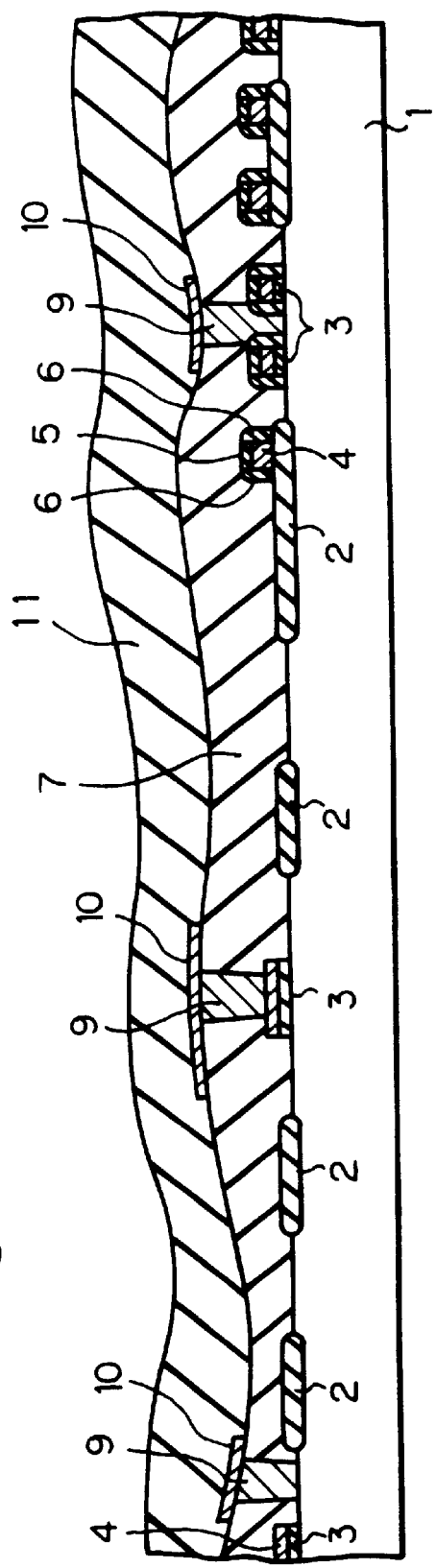

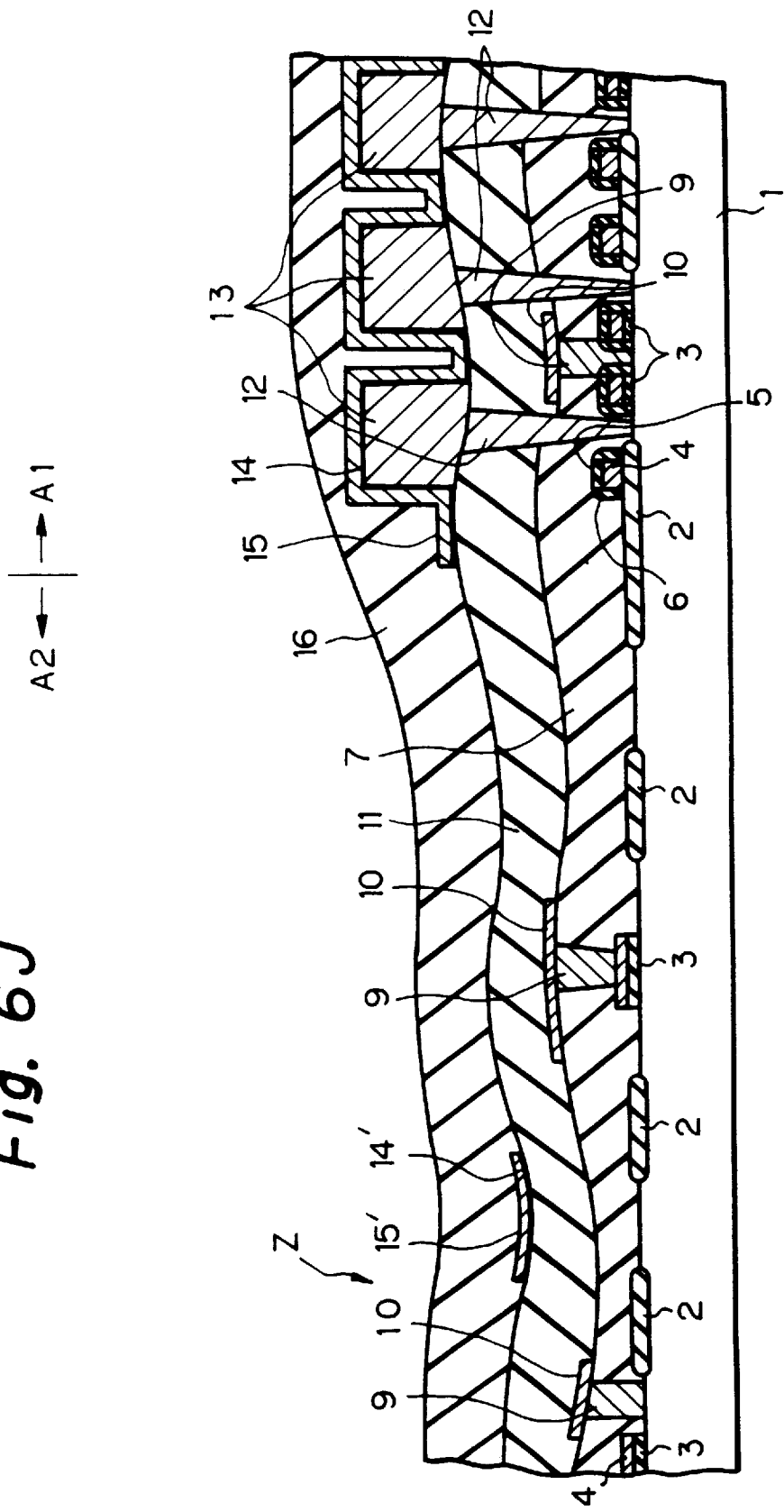

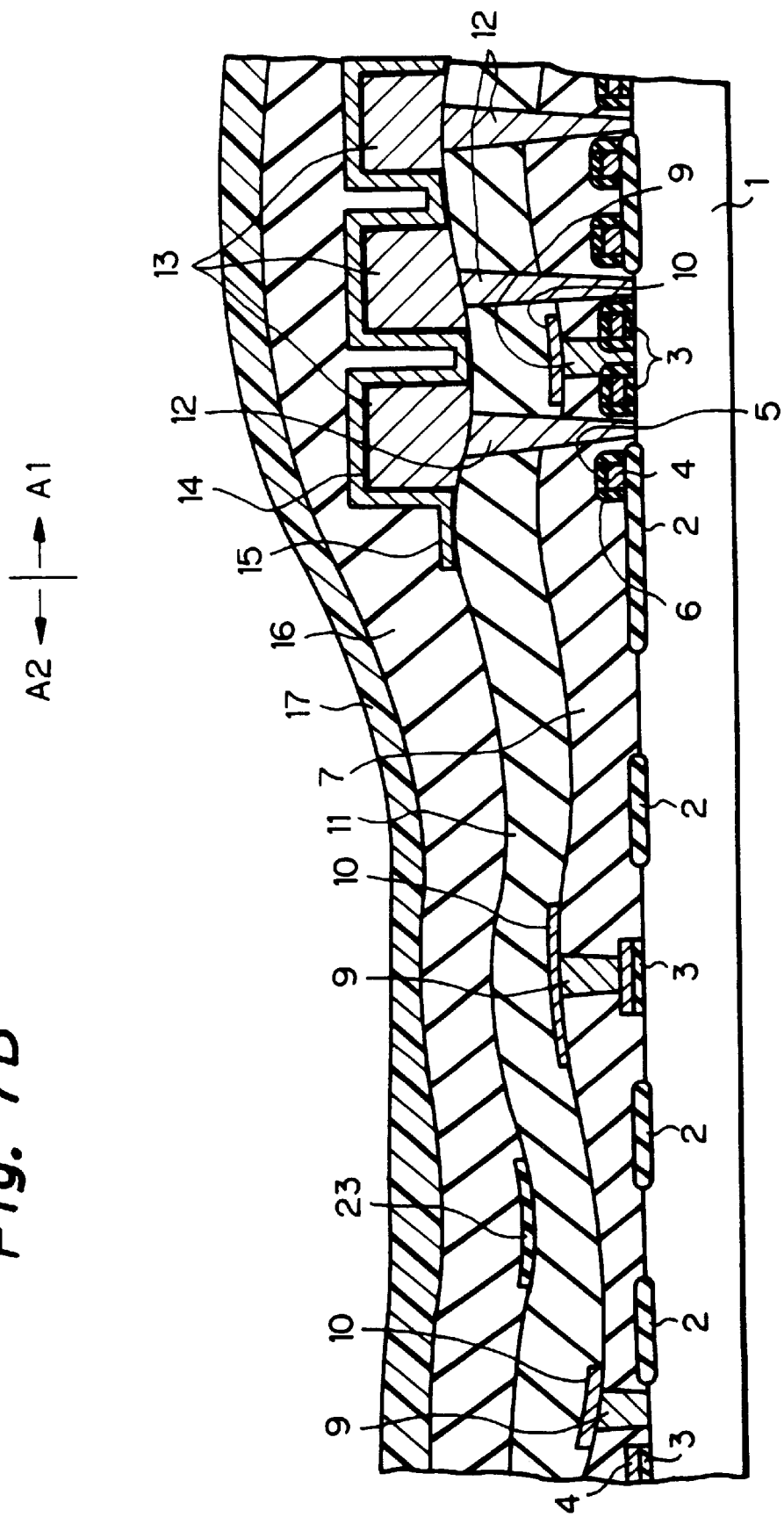

METHOD FOR MANUFACTURING SEMICONDUCTOR DEVICE USING SPIN ON GLASS LAYER

This application is a Division of Ser. No. 08/843,044 Apr. 11, 1997 U.S. Pat. No. 5,913,150.

BACKGROUND OF THE INVENTION

1. Field of the Invention

The present invention relates to a method for manufacturing a semiconductor device using a spin on glass (SOG) layer

2. Description of the Related Art

With the development of integrated circuit devices such as a dynamic random access memory (DRAM) device, a three-dimensional construction has been adopted. As a result, the surfaces of layers forming the device have become uneven, thus creating short-circuits and disconnections of wiring patterns. On the other hand, in a photolithography apparatus, i.e., a stepper, as devices have become more fine-structured, the numerical aperture of a lens has been increased and the wavelength of light has been decreased, so that the focus depth has become shallow. Therefore, the flat characteristics of each layer have become more important.

In a first prior art method for manufacturing a semiconductor device, a boron-included phosphorus-silicated glass (BPSG) layer is formed by an atmospheric chemical vapor deposition (CVD) process, and the BPSG layer is annealed at a high temperature to reflow it. Thus, the surface of the BPSG layer is flattened. This is advantageous in that it is a simple process.

In the first prior art method, however, if the reflowing temperature is reduced, it is impossible to reflow the BPSG layer. Therefore, the reflowing temperature needs to be high, thus enlarging the junction depth of the device. This is disadvantageous for obtaining a fine structure.

In a second prior art method for manufacturing a semiconductor device, if an uneven insulating layer is formed, an SOG solution is spin-coated on the uneven insulating layer to form an SOG layer thereon. Then, the SOG layer is etched back, so that the surface of the SOG layer as well as the insulating layer is flattened.

In the second prior art method, however, when a contact hole is perforated in the SOG layer and the insulating layer which are flattened, the SOG layer is exposed, so that the SOG layer is in contact with a conductive layer buried in the contact hole. Therefore, water of the SOG layer reacts with the conductive layer, so that the conductive layer is eroded. Thus, short-circuits and disconnections of the conductive layer may be invited.

In order to separate the conductive layer buried in the contact hole from the SOG layer in the second prior art method, in a third prior art method for manufacturing a semiconductor device (see JP-A-7-74248), a dummy insulating pattern layer is formed on a portion of the insulating layer where the above-mentioned contact hole will be formed. As a result, the dummy insulating pattern layer is located between the conductive layer and the SOG layer. Therefore, water of the SOG layer hardly reacts with the conductive layer, so that the conductive layer is not eroded. Thus, short-circuits and disconnections of the conductive layer can be avoided. This will be explained later in detail.

In the third prior art method, however, the flat characteristics of the etched SOG layer including the dummy insulating pattern layer are actually deteriorated. That is, in order to completely remove the part of the SOG layer on the dummy insulating pattern layer, an overetching of the SOG layer is required. Note that the etching rate of the SOG layer is usually larger than that of the dummy insulating pattern layer. As a result, a large step between the etched SOG layer and the dummy insulating pattern layer is generated, thus deteriorating the flat characteristics of the etched SOG layer including the dummy insulating pattern layer.

In addition, in the third prior art method, an additional process for forming the dummy insulating pattern layer is required, thus increasing the manufacturing cost.

SUMMARY OF THE INVENTION

It is an object of the present invention to provide a method for manufacturing a semiconductor device using SOG and having excellent flat characteristics.

Another object is to provide a method for manufacturing a semiconductor device using SOG and capable of decreasing the manufacturing cost.

According to the present invention, in a method for manufacturing a semiconductor device, a dummy pattern layer is provided on a layer which is located below an insulating layer on which an SOG layer is formed. The insulating layer is flattened by etching back the SOG layer. Then, a contact hole is perforated in the insulating layer and the dummy pattern layer and the layer below the insulating layer, and a conductive layer is buried in the contact hole. As a result, the surface of the insulating layer is more flat as compared with the third prior art. Therefore, a step between the etched SOG layer and the dummy pattern layer can be smoothed.

The dummy pattern layer can be a conductive layer or an insulating layer which is manufactured simultaneously with other material. Therefore, an additional process for the dummy pattern layer is unnecessary.

BRIEF DESCRIPTION OF THE DRAWINGS

The present invention will be more clearly understood from the description as set forth below, as compared with the prior art, with reference to the accompanying drawings, wherein:

FIGS. 4A through 4M are cross-sectional views for explaining a first embodiment of the method for manufacturing a DRAM device according to the present invention;

FIGS. 6A through 6M are cross-sectional views for explaining a second embodiment of the method for manufacturing a DRAM device according to the present invention; and FIGS. 7A through 7F are cross-sectional views for explaining a third embodiment of the method for manufacturing a DRAM device according to the present invention.

DESCRIPTION OF THE PREFERRED EMBODIMENTS

Before the description of the preferred embodiments, a prior art method for manufacturing a semiconductor device will be explained with reference to FIGS. 1A through 1I, and FIGS. 2A and 2B (see JP-A-7-74248).

Figure 1A:
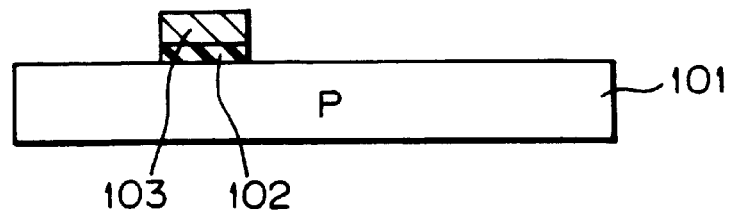
FIGS. 1A through 1I are cross-sectional views for explaining a prior art method for manufacturing a semiconductor device.

First, referring to FIG. 1A, a P type monocrystalline silicon substrate 101 is thermally oxidized to form a gate silicon oxide layer 102 thereon. Then, a gate electrode 103 is formed on the gate silicon oxide layer 102. The gate electrode 103 and the gate silicon oxide layer 102 are patterned as illustrated in FIG. 1A.

Figure 1B:
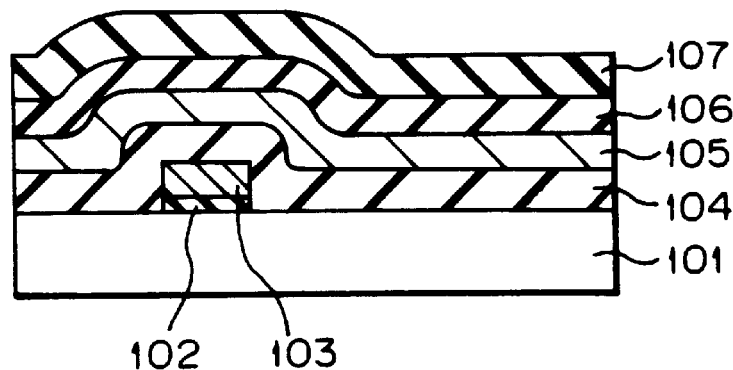

Next, referring to FIG. 1B, a silicon oxide layer 104 is formed on the entire surface by a plasma process, and an aluminum pattern layer 105 is formed thereon. In this case, the silicon oxide layer 104 is stepped due to the presence of the gate silicon oxide layer 102 and the gate electrode 103. Then, a dummy silicon oxide layer 107 is formed on the entire surface by a plasma CVD process.

Figure 1C:
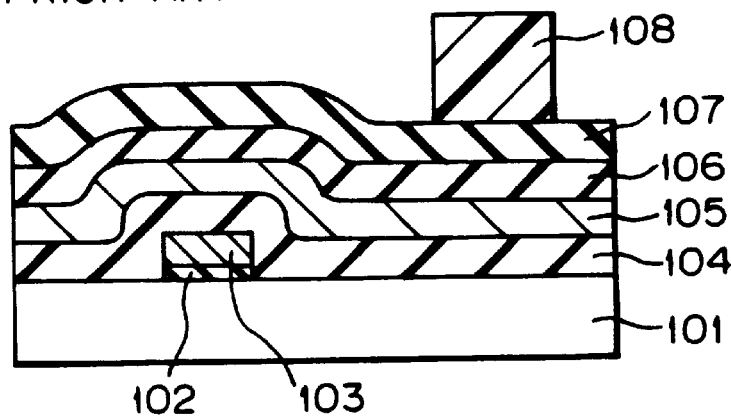

Next, referring to FIG. 1C, a square photoresist pattern 108 is formed by a photolithography process.

Figure 1D:
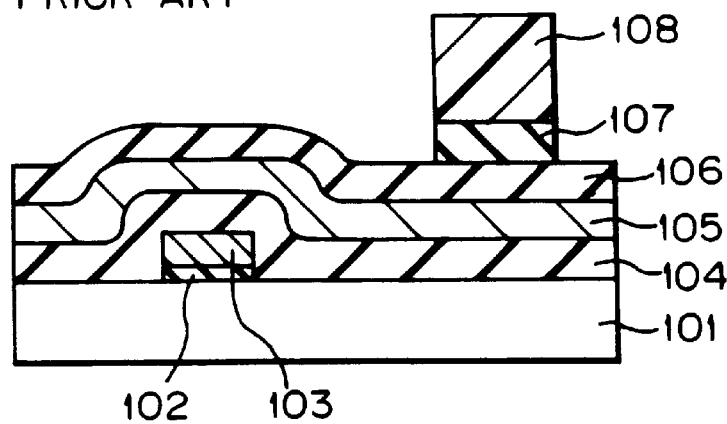

Next, referring to FIG. 1D, the dummy silicon oxide layer 107 is etched by using the photoresist pattern 108 as a mask. Then, the photoresist pattern 108 is removed.

Figure 1E:
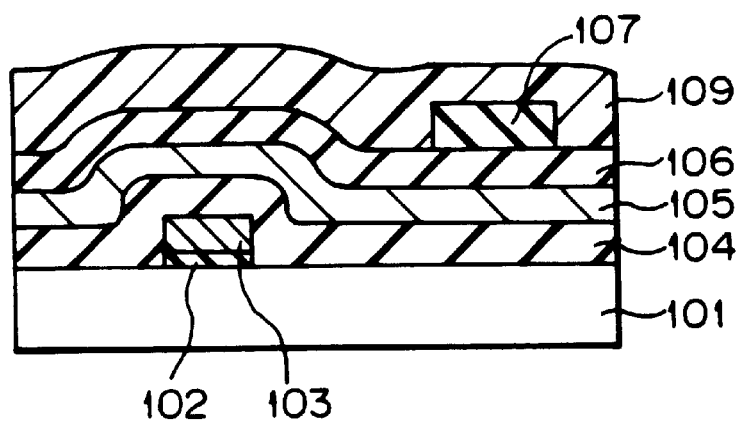

Next, referring to FIG. 1E, an SOG solution is spin-coated and calcined to form an SOG layer 109.

Figure 1F:
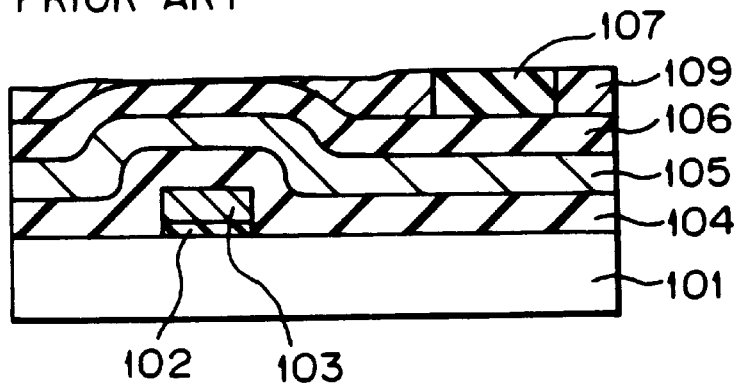

Next, referring to FIG. 1F, the SOG layer 109 is etched back, so that the SOG layer 109 as well as the dummy silicon is flattened.

Figure 1G:
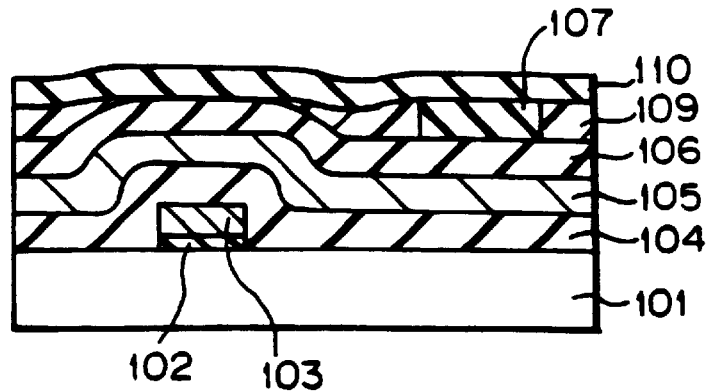

Next, referring to FIG. 1G, a silicon oxide layer 110 is formed on the entire surface by a plasma CVD process.

Figure 1H:
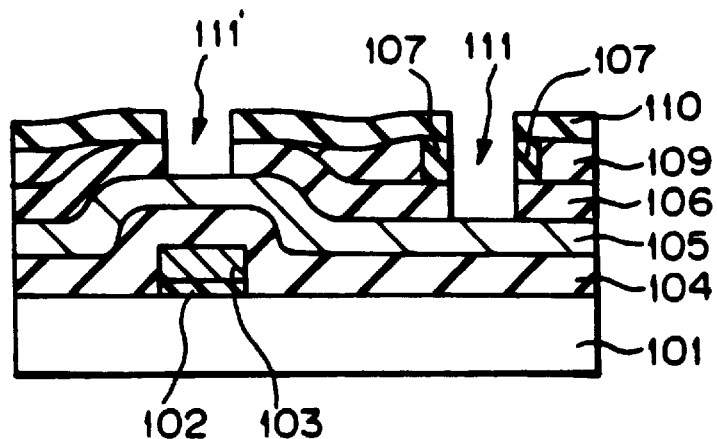

Next, referring to FIG. 1H, contact holes 111 and 111' are perforated in the silicon oxide layers 110, 107 and 106 by a photolithography and etching process. In this case, the contact hole 111 is located within the dummy silicon oxide layer 107.

Figure 1I:
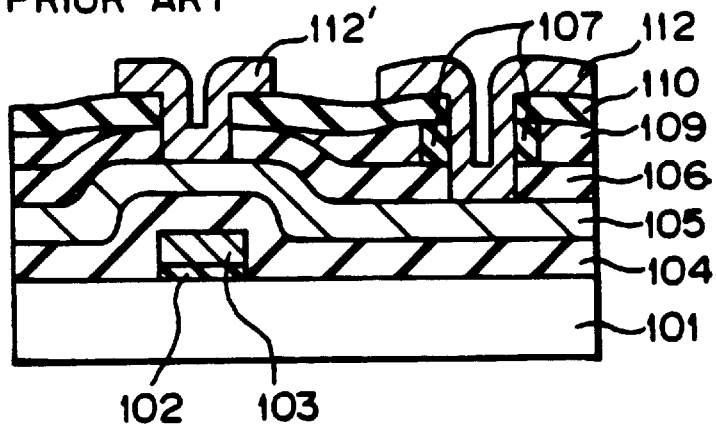

Finally, referring to FIG. 1I, an aluminum layer is deposited and patterned to form aluminum pattern layers 112 and 112'.

Thus, in the semiconductor device manufactured by the steps as illustrated in FIGS. 1A through 1I, since the SOG layer 109 is completely sealed by the silicon oxide layers 106, 107 and 110, the SOG layer 109 is never in contact with the aluminum layers 112 and 112'. Therefore, water included in the SOG layer 109 hardly reacts with the aluminum layers 112 and 112', so that the aluminum layers 112 and 112' are hardly eroded. Thus, the disconnection of the aluminum layers 112 and 112' can be avoided.

Figure 2A:
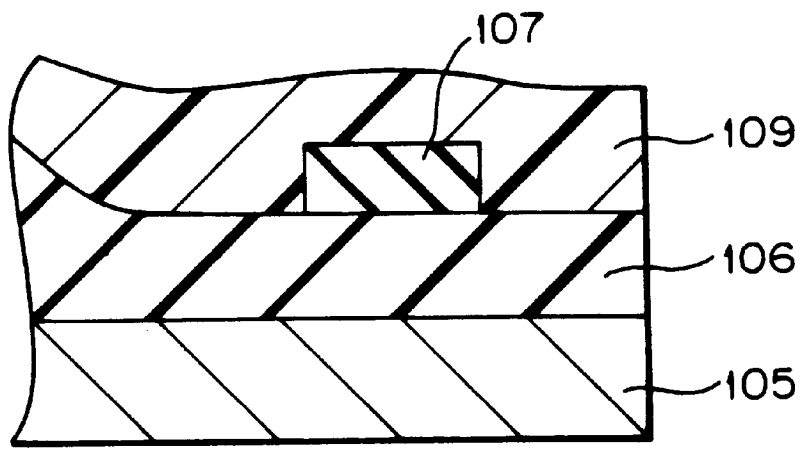
FIGS. 2A and 2B are partly-enclarged cross-sectional views of FIGS. 1E and 1F, respectively.
Figure 2B:
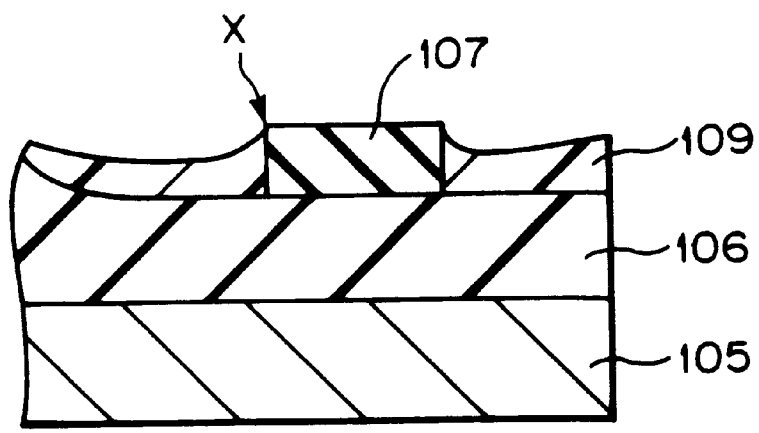

In the manufacturing method as illustrated in FIGS. 1A through 1I, however, the flat characteristics of the etched SOG layer 109 including the dummy silicon oxide layer 107 are actually deteriorated. That is, as illustrated in FIGS. 2A and 2B which are partial enlargements of FIGS. 1E and 1F, in order to completely remove the part of the SOG layer 109 on the dummy silicon oxide layer 107, an overetching of the SOG layer 109 is required. Note that the etching rate of the SOG layer 109 is usually larger than that of the dummy silicon oxide layer 107. As a result, a large step between the etched SOG layer 109 and the dummy silicon oxide layer 107 is generated as indicated by X in FIG. 2B, thus deteriorating the flat characteristics of the etched SOG layer 109 including the dummy silicon oxide layer 107.

In addition, in the manufacturing method as illustrated in FIGS. 1A through 1I, an additional process for forming the dummy silicon oxide layer 107 is required, thus increasing the manufacturing cost.

Figure 3A:
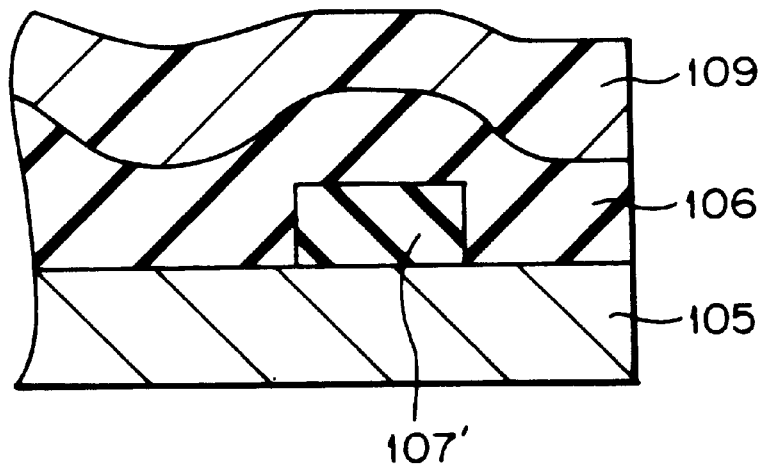
FIGS. 3A and 3B are cross-sectional views for explaining a principle of the present invention.
Figure 3B:
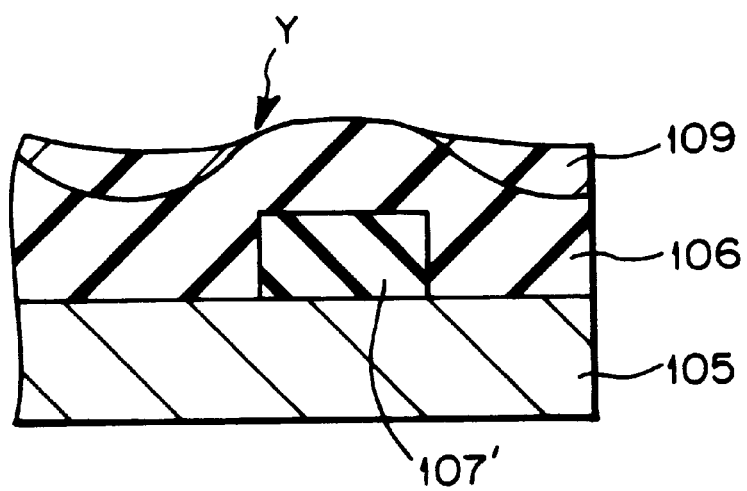

In FIGS. 3A and 3B, which are cross-sectional views illustrating a principle of the present invention, a dummy pattern layer 107' is provided instead of the dummy silicon oxide layer 107 of FIGS. 2A and 2B. That is, the dummy pattern layer 107' is provided on a layer such as the aluminum layer 105 below the silicon oxide layer 106 on which the SOG layer 109 is spin-coated. As a result, the surface of the silicon oxide layer 106 of FIG. 3A is more flat as compared with the surface of the silicon oxide layer 106 including the dummy silicon oxide layer 107 of FIG. 2A. Therefore, a step between the etched SOG layer 109 and the dummy pattern layer 107' as indicated by Y in FIG. 3B can be smoothed.

The dummy pattern layer 107' can be a conductive layer or an insulating layer which is manufactured simultaneously with other material such as the gate electrode 103. Therefore, an additional process for the dummy pattern layer 107' is unnecessary.

FIGS. 4A through 4M are cross-sectional views for explaining a first embodiment of the method for manufacturing a DRAM device according to the present invention. In FIGS. 4A through 4M, A1 designates a cell forming area, and A2 designates a peripheral circuit forming area.

Figure 4A:
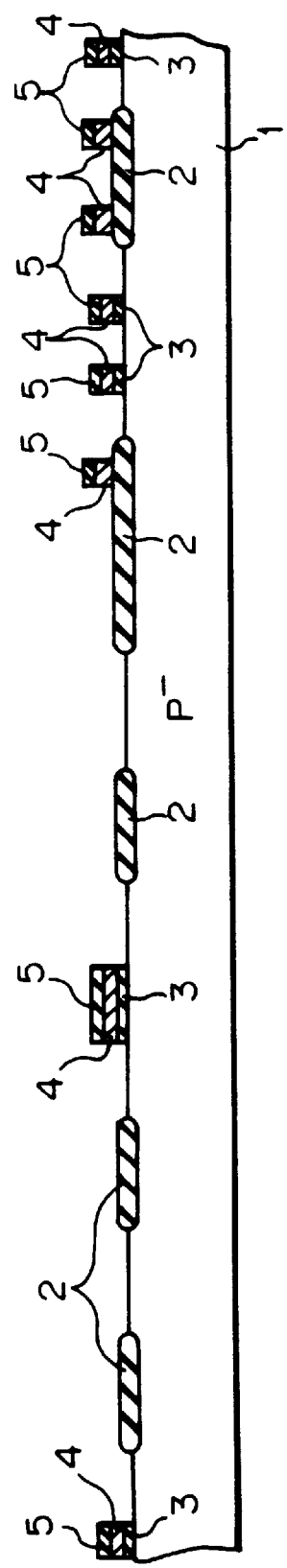

First, referring to FIG. 4A, a P⁻-type monocrystalline silicon substrate 1 is thermally oxidized by using a local oxidation of silicon (LOCOS) process to form a field silicon oxide layer 2 for isolating active areas. Then, the silicon substrate 1 is thermally oxidized to form a gate silicon oxide layer 3 thereon. Then, a gate electrode layer 4 is deposited on the gate silicon oxide layer 3, and also, a silicon nitride layer 5 is deposited on the gate electrode layer 4. Then, the silicon nitride layer 5, the gate electrode layer 4 and the gate silicon oxide layer 3 are patterned by a photolithography and etching process. In this state, N-type impurities are implanted into the silicon substrate 1, to form N⁻-type impurity doped regions (not shown) therein.

Figure 4B:
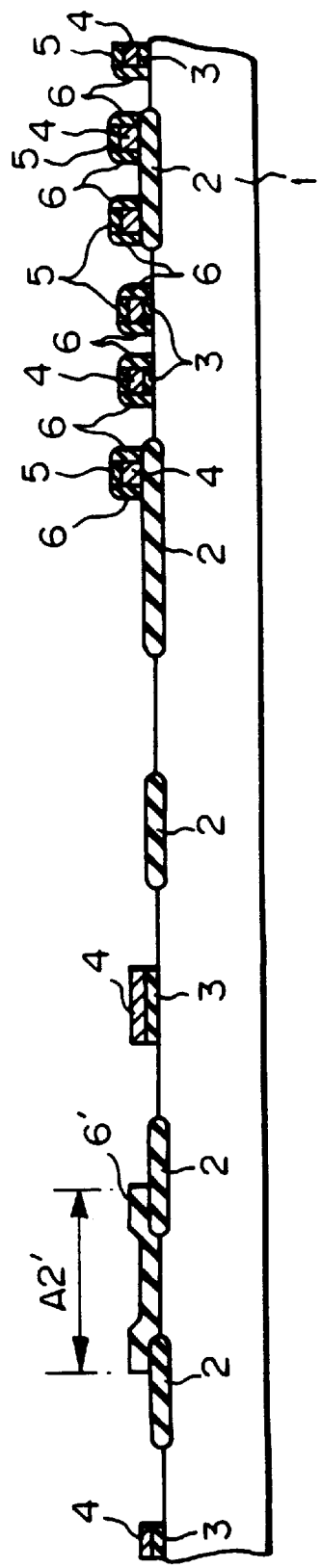

Next, referring to FIG. 4B, a silicon nitride layer is deposited. Then, a photoresist pattern (not shown) is formed on only a portion A2' of the peripheral circuit forming area A2, and then, the silicon nitride layer is etched back. In addition, a photoresist pattern (not shown) is again formed on the cell forming area A1 and a portion of the peripheral circuit forming area A2 larger than the area A2', and then, the exposed silicon nitride layer is etched. As a result, a sidewall silicon nitride layer 6 is formed on the sidewalls of the gate electrode layer 4 in the cell forming area A1, and simultaneously, a silicon nitride layer 6' is formed in the portion A2' of the peripheral circuit forming area A2 where a contact hole will be formed. In this state, N-type impurities are implanted into the silicon substrate 1 to form N⁺-type impurity doped regions (not shown) therein.

In FIG. 4B, the silicon nitride layers 5 and 6 of the cell forming area A1 serve as an etching stopper, when a contact hole is formed. The silicon nitride layer 6' of the peripheral circuit forming area A2 serves as a dummy pattern layer.

Next, referring to FIG. 4C, an insulating layer 7 made of BPSG is deposited on the entire surface. In this case, the insulating layer 7 is flattened by reflowing it at a high temperature.

Next, referring to FIG. 4D, contact holes 8, 8' and 8" are perforated in the insulating layer 7 by a photolithography and etching process. In this case, as stated above, the silicon nitride layer 6 serves as an etching stopper, and therefore, the contact hole 8 is formed in self-alignment with the silicon nitride layer 6. Also, the gate electrode layer 4 is exposed in the contact hole 8'. Further, the silicon substrate 1 is exposed in the contact hole 8".

Next, referring to FIG. 4E, a conductive layer 9 made of polycrystalline silicon or the like is buried in the contact holes 8, 8' and 8". Then, a bit line layer 10 is formed and patterned on the conductive layers. The bit line layer 10 is connected via the conductive layer 9 to the N$^+$-type impurity doped regions (not shown) in the silicon substrate 1.

Next, referring to FIG. 4F, an insulating layer 11 made of BPSG is deposited on the entire surface. In this case, the insulating layer 10 is flattened by reflowing it at a high temperature.

Figure 4G:
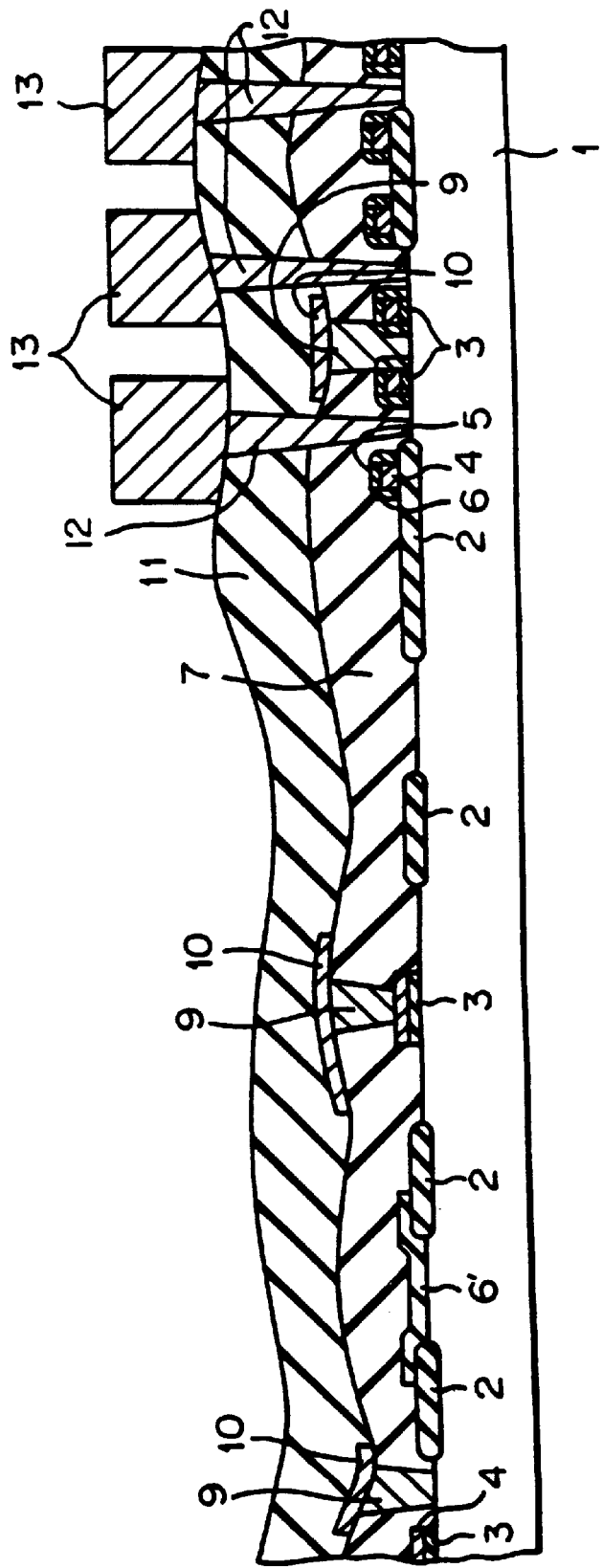

Next, referring to FIG. 4G, contact holes are perforated in the insulating layers 11 and 7, and conductive layers 12 made of polycrystalline silicon or the like are buried in the contact holes. Then, a conductive layer is deposited and patterned to form capacitor lower electrode layers 13. The capacitor lower electrode layers 13 are connected via the conductive layers 12 to the N$^+$-type impurity doped regions (not shown) in the silicon substrate 1.

Next, referring to FIG. 4H, a capacitor insulating layer 14 is formed on the capacitor lower electrode layers 13, and also, a capacitor upper electrode layer 15 is formed on the capacitor insulating layer 14. Then, the capacitor insulating layer 14 and the capacitor upper electrode layer 13 are patterned by a photolithography and etching process.

Figure 4I:
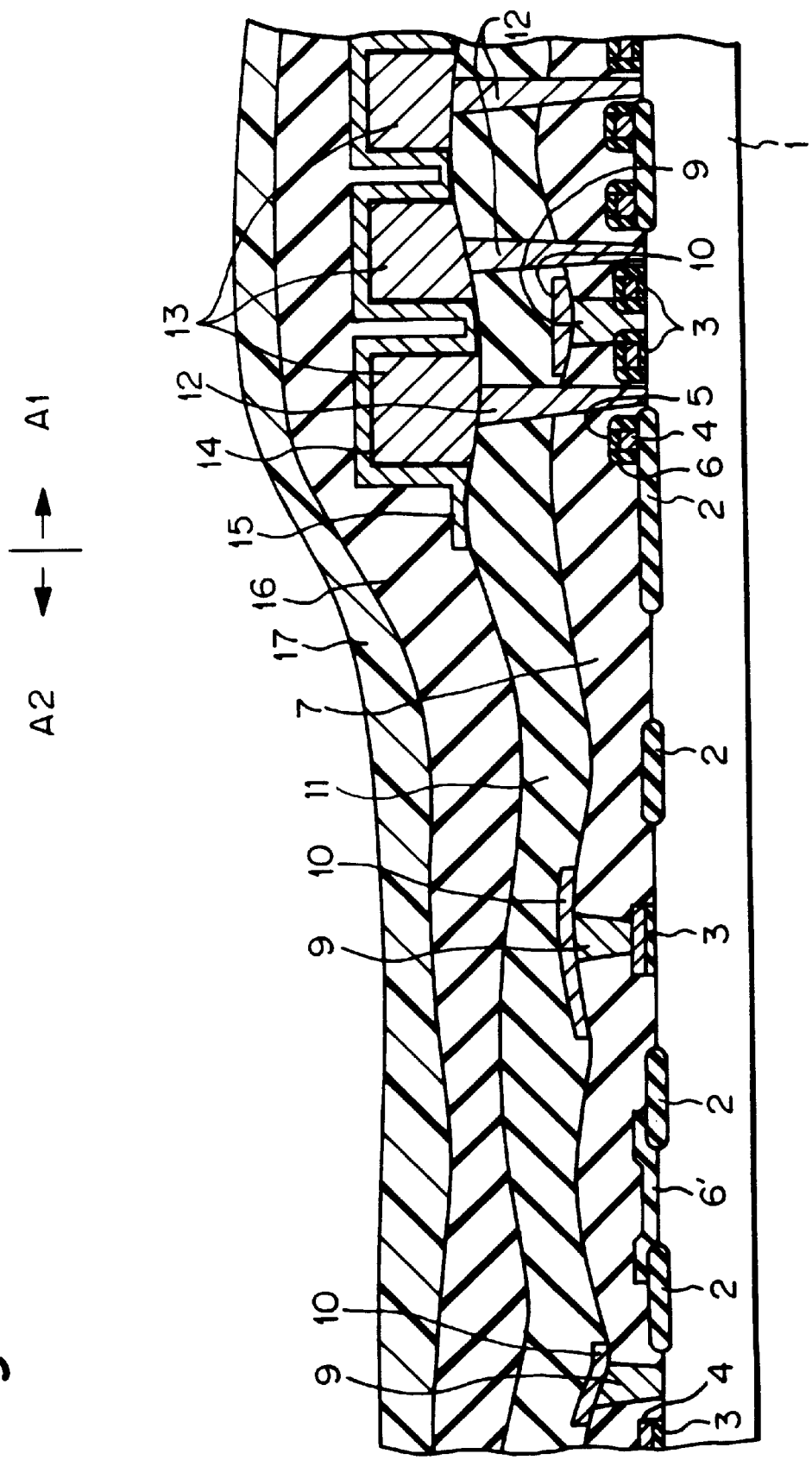

Next, referring to FIG. 4I, an insulating layer 16 made of silicon oxide is deposited on the entire surface, and then, SOG solution is spin-coated on the insulating layer 16, to form an SOG layer 17 thereon.

Next, referring to FIG. 4J, the SOG layer 17 as well as the insulating layer 16 is etched back to flatten the insulating layer 16. In this case, since the surface of the insulating layer 16 above the dummy silicon oxide layer 6' is already smooth, there is no residual layer of the SOG layer 17 as indicated by Z in FIG. 4J.

Next, referring to FIG. 4K, an insulating layer 17 made of silicon oxide or the like is deposited on the entire surface.

Figure 4L:
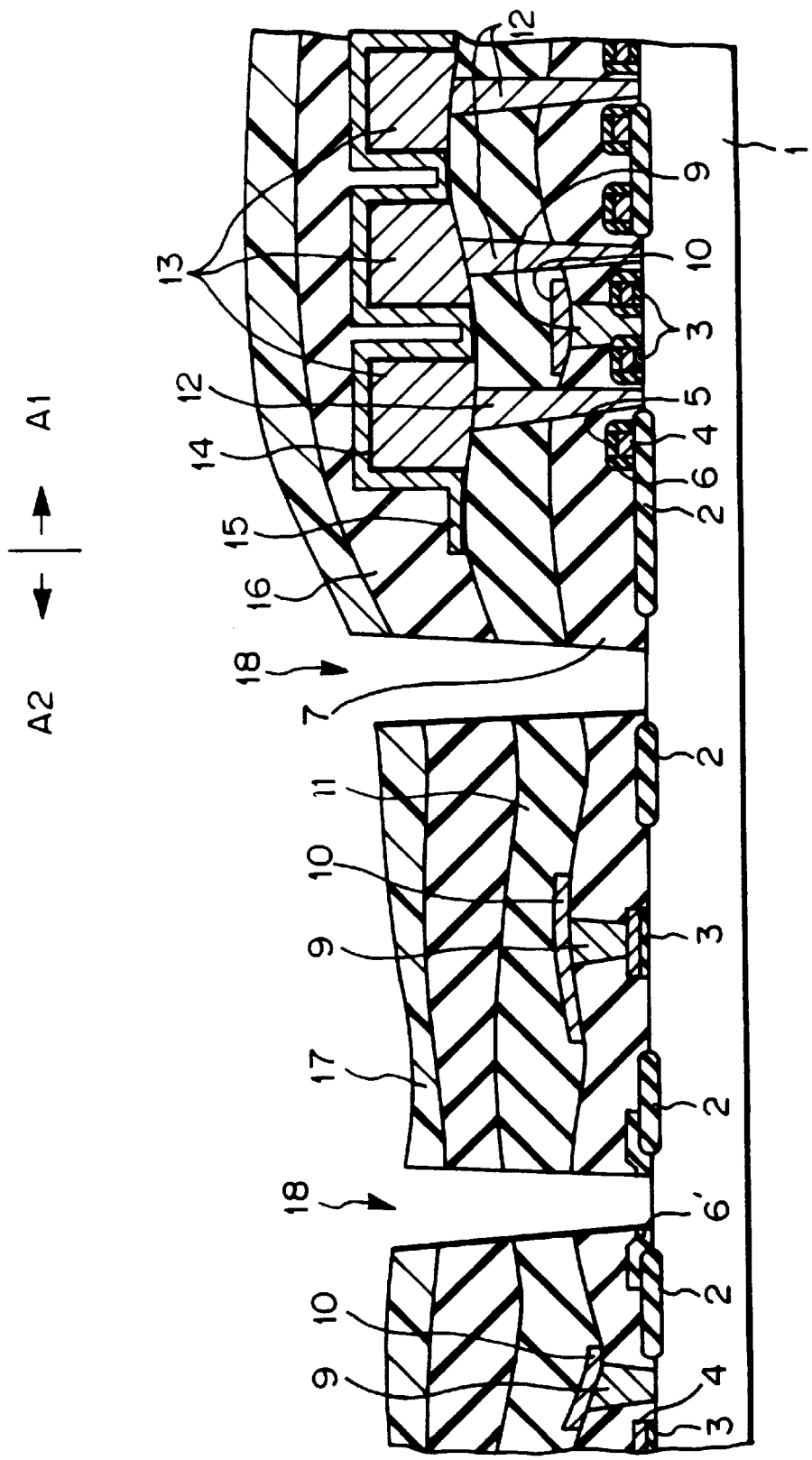

Next, referring to FIG. 4L, contact holes 18 are perforated in the insulating layers 17, 16, 11 and 7 and the dummy silicon nitride layer 6'. In this case, since the SOG layer 17 is completely removed, the SOG layer is never exposed in the contact holes 18.

Figure 4M:
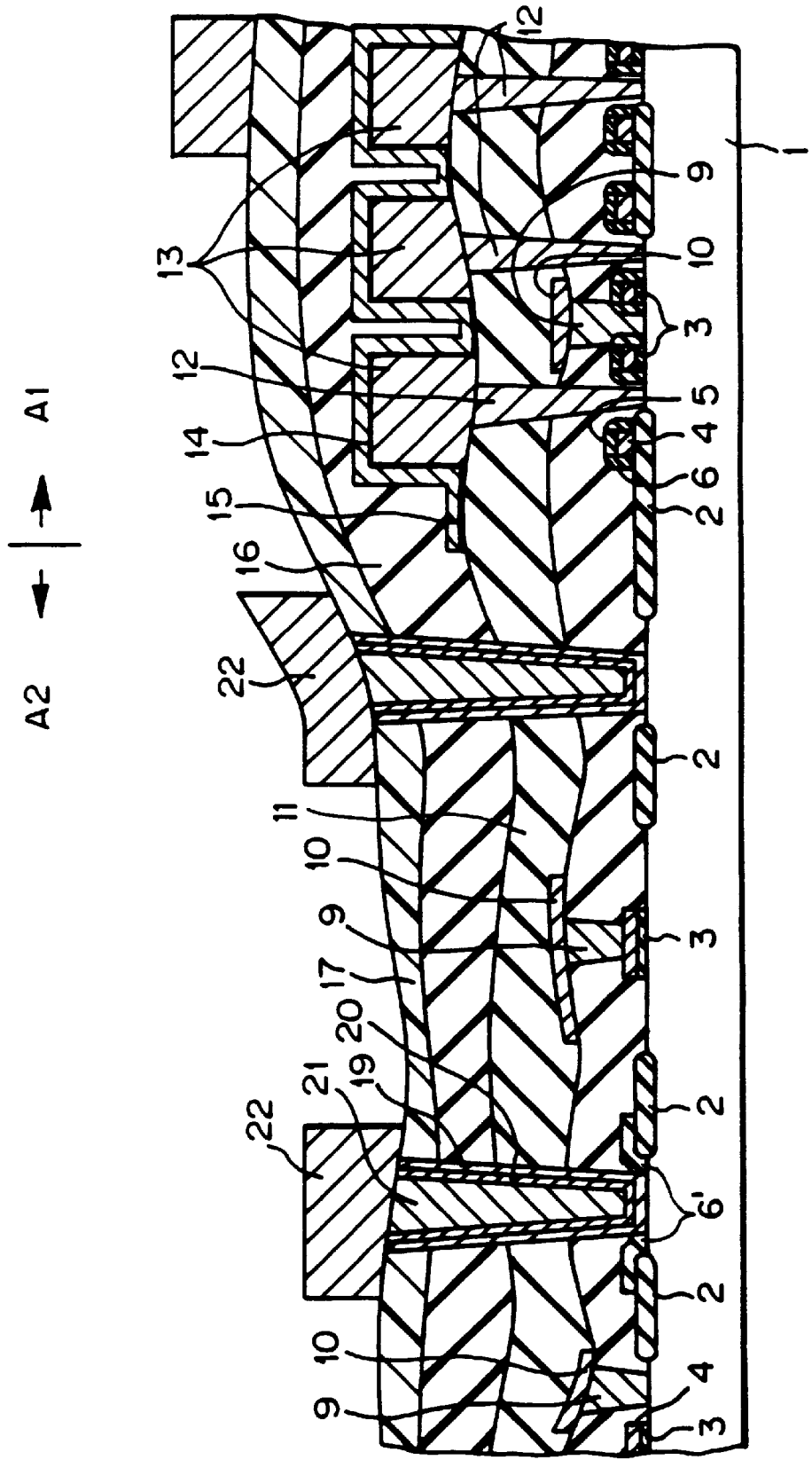

Finally, referring to FIG. 4M, a titanium layer 19, a titanium nitride layer 20 and a tungsten layer 21 are deposited and etched back, so that the layers 19, 20 and 21 are buried in the contact holes 18. Further, an aluminum layer 22 is deposited and patterned, thus completing the semiconductor device.

Figure 5A:
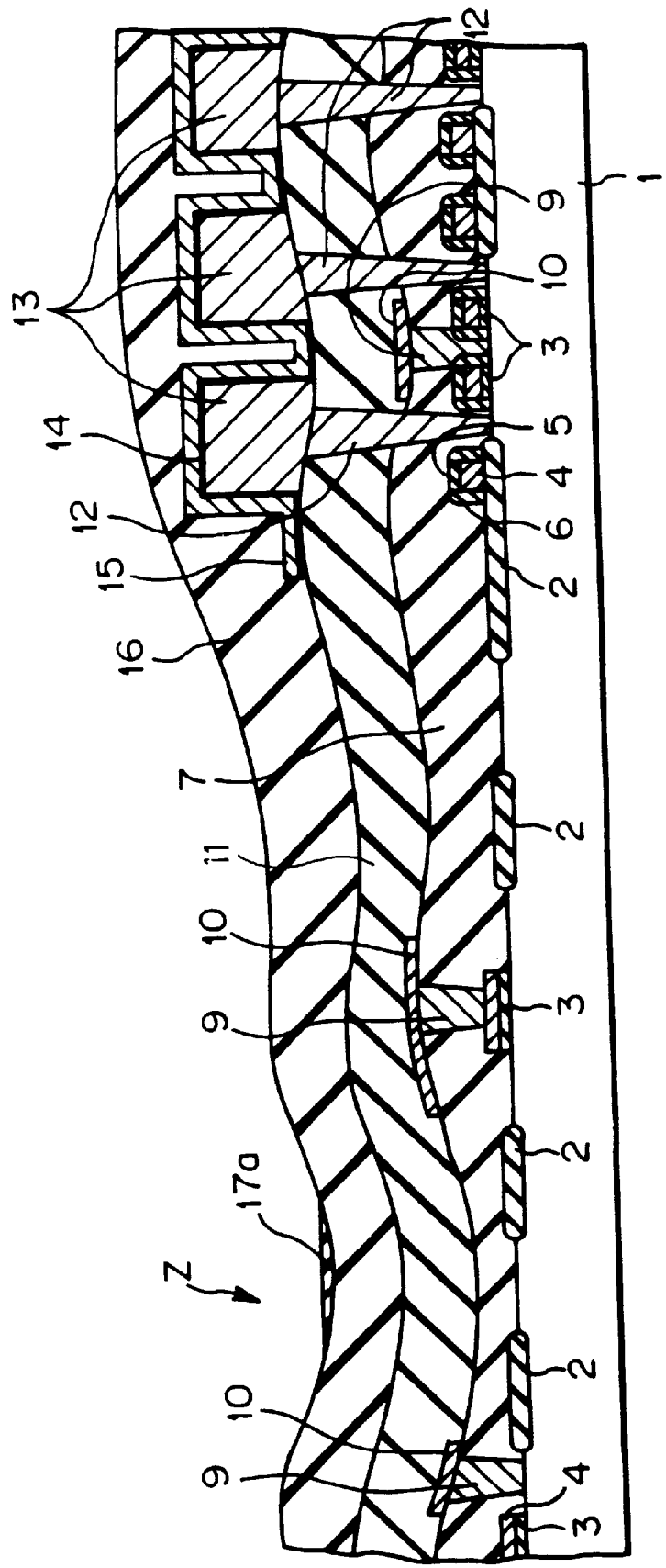
FIGS. 5A and 5B are cross-sectional views for explaining a problem in the prior art method.
Figure 5B:
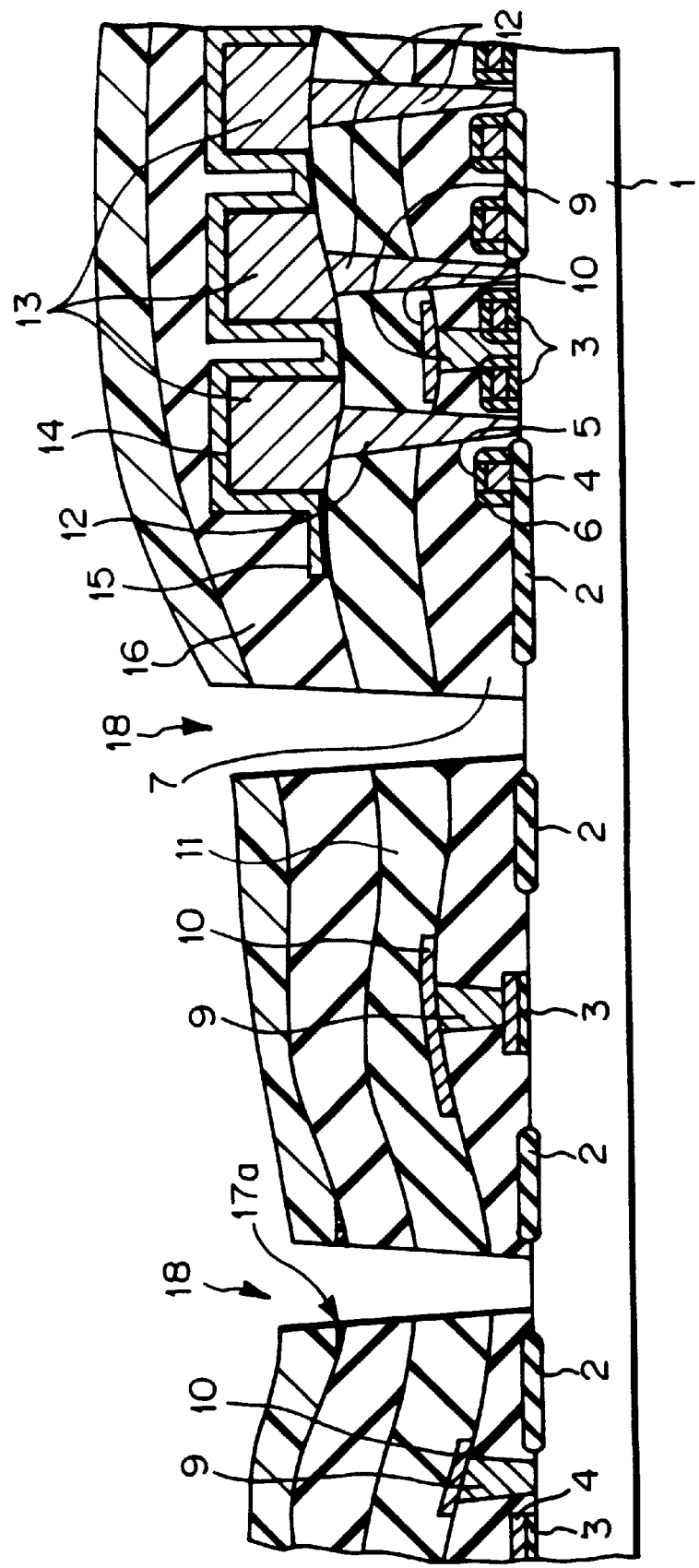

Note that, if the dummy silicon nitride layer 6' is not present, after the SOG layer 17 is etched back, a residual layer 17a of the SOG layer 17 may be left as indicated by Z in FIG. 5A which corresponds to FIG. 4J. As a result, even after the contact holes 18 are perforated, the residual SOG layer 17a is exposed as illustrated in FIG. 5B which corresponds to FIG. 4L. Therefore, water of the residual SOG layer 17a may react with the aluminum layer 22, so that the aluminum layer 22 is eroded.

FIGS. 6A through 6M are cross-sectional views for explaining a second embodiment of the method for manufacturing a DRAM device according to the present invention. Also, in FIGS. 6A through 6M, A1 designates a cell forming area, and A2 designates a peripheral circuit forming area.

First, referring to FIG. 4A, in the same way as in FIG. 4A, a P$^-$-type monocrystalline silicon substrate 1 is thermally oxidized by using a LOCOS process to form a field silicon oxide layer 2 for isolating active areas. Then, the silicon substrate 1 is thermally oxidized to form a gate silicon oxide layer 3 thereon. Then, a gate electrode layer 4 is deposited on the gate silicon oxide layer 3, and also, a silicon nitride layer 5 is deposited on the gate electrode layer 4. Then, the silicon nitride layer 5, the gate electrode layer 4 and the gate silicon oxide layer 3 are patterned by a photolithography and etching process. In this state, N-type impurities are implanted into the silicon substrate 1, to form N$^-$-type impurity doped regions (not shown) therein.

Figure 6A:
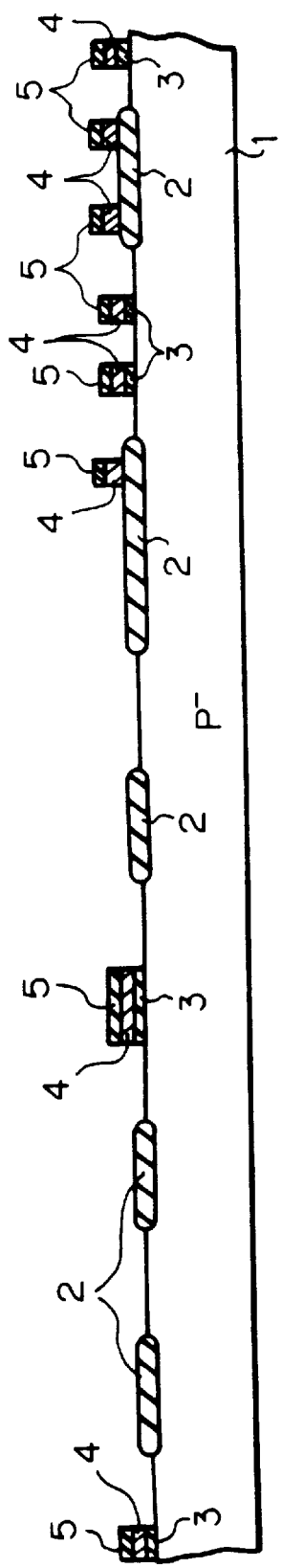
Figure 6B:
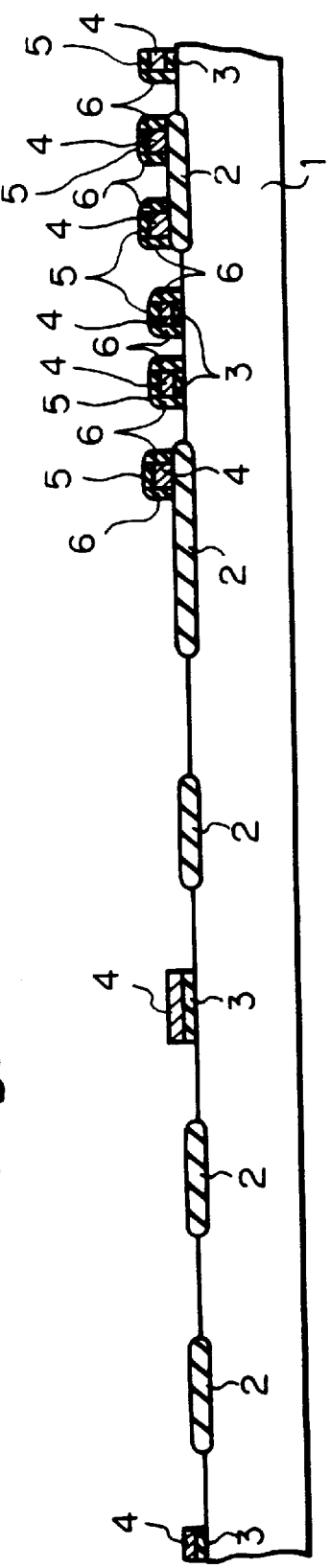

Next, referring to FIG. 6B, in a similar way to that of FIG. 4B, a silicon nitride layer is deposited. Then, a the silicon nitride layer is etched back. In addition, a photoresist pattern (not shown) is formed on the cell forming area A1, and then, the exposed silicon nitride layer is etched. As a result, a sidewall silicon nitride layer 6 is formed on the sidewalls of the gate electrode layer 4 in the cell forming area A1. In this state, N-type impurities are implanted into the silicon substrate 1 to form N$^+$-type impurity doped regions (not shown) therein.

In FIG. 6B, the silicon nitride layers 5 and 6 of the cell forming area A1 serve as an etching stopper, when a contact hole is formed.

Figure 6C:
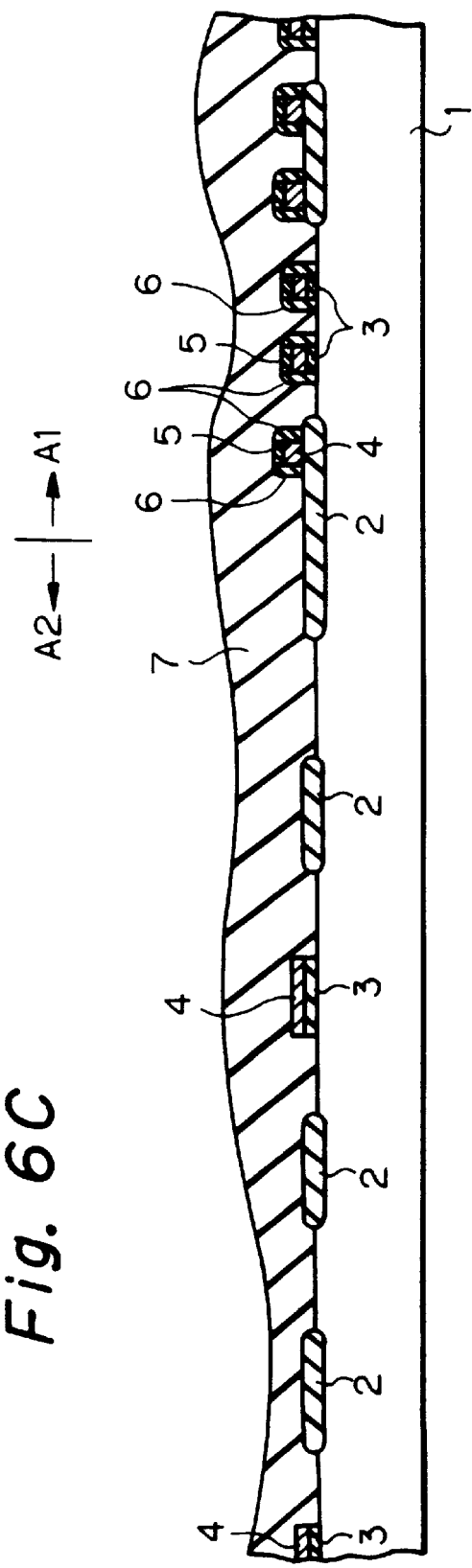

Next, referring to FIG. 6C, in the same way as in FIG. 4C, an insulating layer 7 made of BPSG is deposited on the entire surface. In this case, the insulating layer 7 is flattened by reflowing it at a high temperature.

Figure 6D:
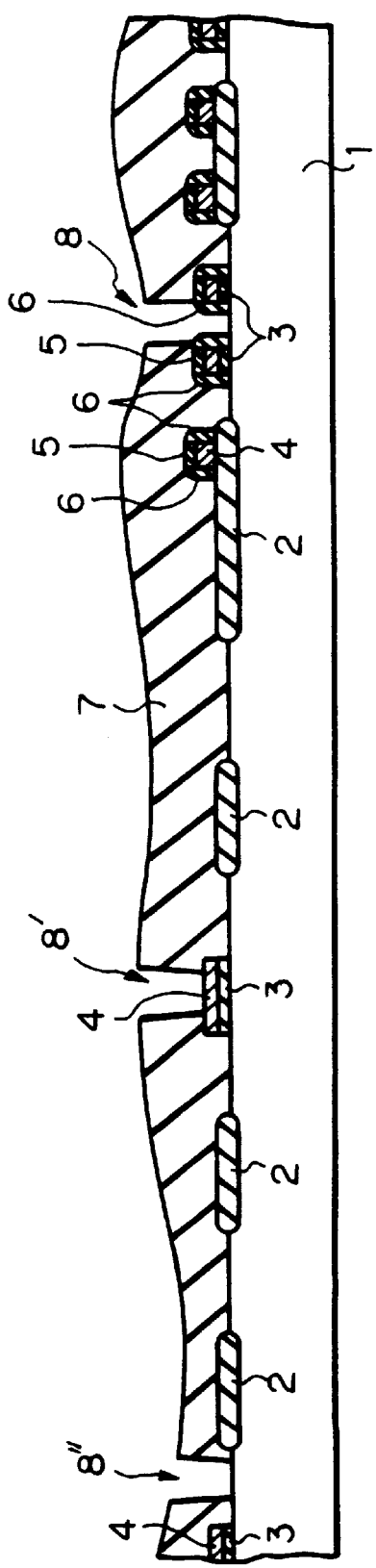

Next, referring to FIG. 6D, in the same way as in FIG. 4D, contact holes 8, 8' and 8" are perforated in the insulating layer 7 by a photolithography and etching process. In this case, as stated above, the silicon nitride layer 6 serves as an etching stopper, and therefore, the contact hole 8 is formed in self-alignment with the silicon nitride layer 6. Also, the gate electrode layer 4 is exposed in the contact hole 8'.

Next, referring to FIG. 6E, in the same way as in FIG. 4E, a conductive layer 9 made of polycrystalline silicon or the like is buried in the contact holes 8, 8' and 8". Then, a bit line layer 10 are formed and patterned on the conductive layer 9. The bit line layer 10 is connected via the conductive layer 9 to the N$^+$-type impurity doped regions (not shown) in the silicon substrate 1.

Next, referring to FIG. 6F, in the same way as in FIG. 4F, an insulating layer 10 made of BPSG is deposited on the entire surface. In this case, the insulating layer 10 is flattened by reflowing it at a high temperature.

Figure 6G:
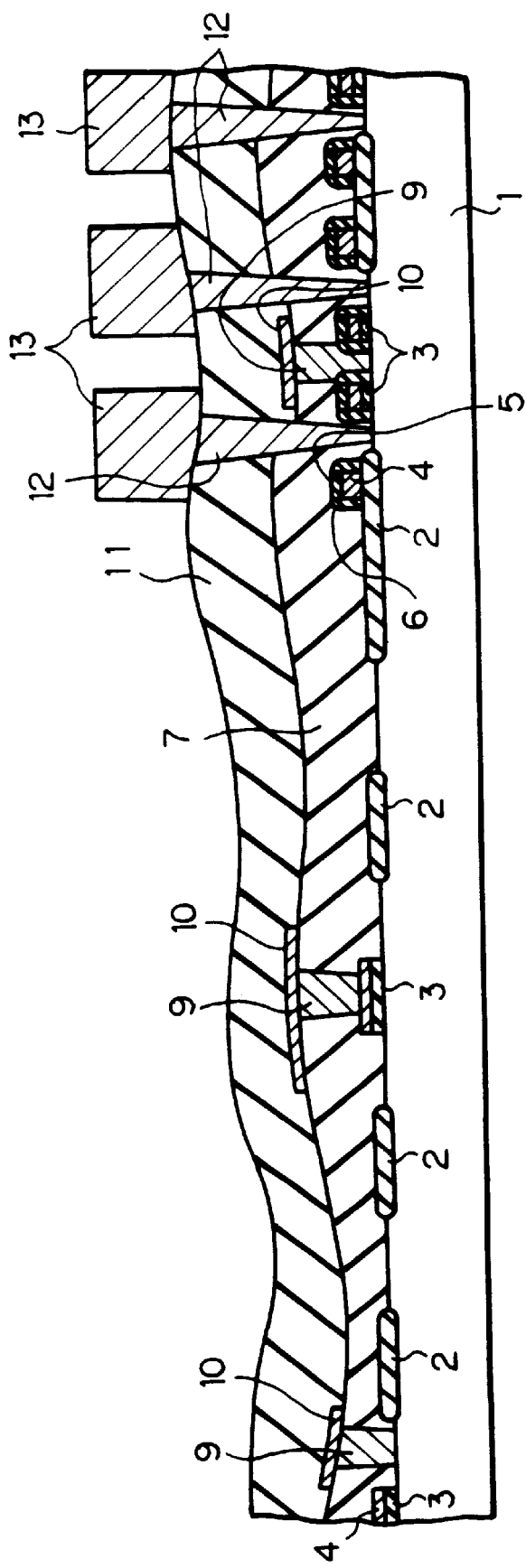

Next, referring to FIG. 6G, in the same way as in FIG. 4G, contact holes are perforated in the insulating layers 11 and 10, and conductive layer 12 made of polycrystalline silicon or the like are buried in the contact holes. Then, a conductive layer is deposited and patterned to form capacitor lower electrode layers 13. The capacitor lower electrode layers 13 are connected via the conductive layers 12 to the N$^+$-type impurity doped regions (not shown) in the silicon substrate 1.

Figure 6H:
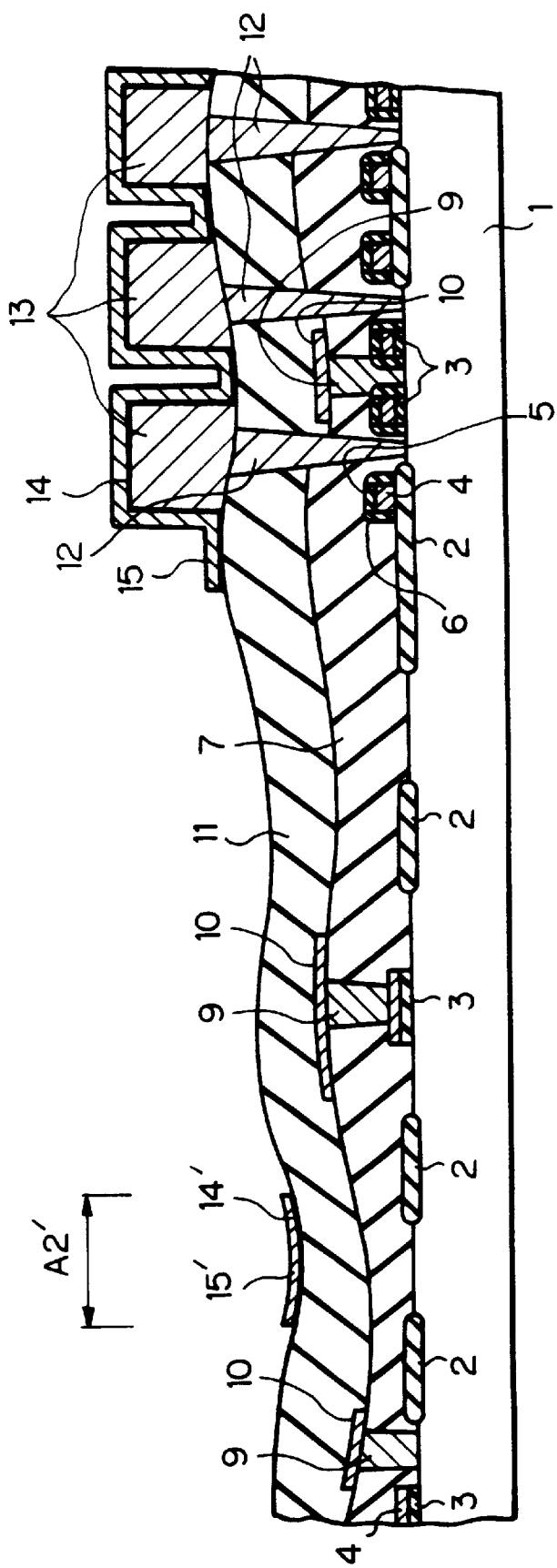

Next, referring to FIG. 6H, in a similar way to that of FIG. 4H, a capacitor insulating layer is formed on the entire surface, and also, a capacitor upper electrode layer is formed on the capacitor insulating layer. Then, the capacitor insulating layer and the capacitor upper electrode layer are patterned by a photolithography and etching process. As a result, a capacitor insulating layer 14 and a capacitor upper electrode layer 15 are formed on the cell forming area A1, and simultaneously, a dummy capacitor insulating layer 14' and a dummy capacitor upper electrode layer 15' are formed in a portion A2' of the peripheral circuit forming area A2 where a contact hole will be formed.

Figure 6I:
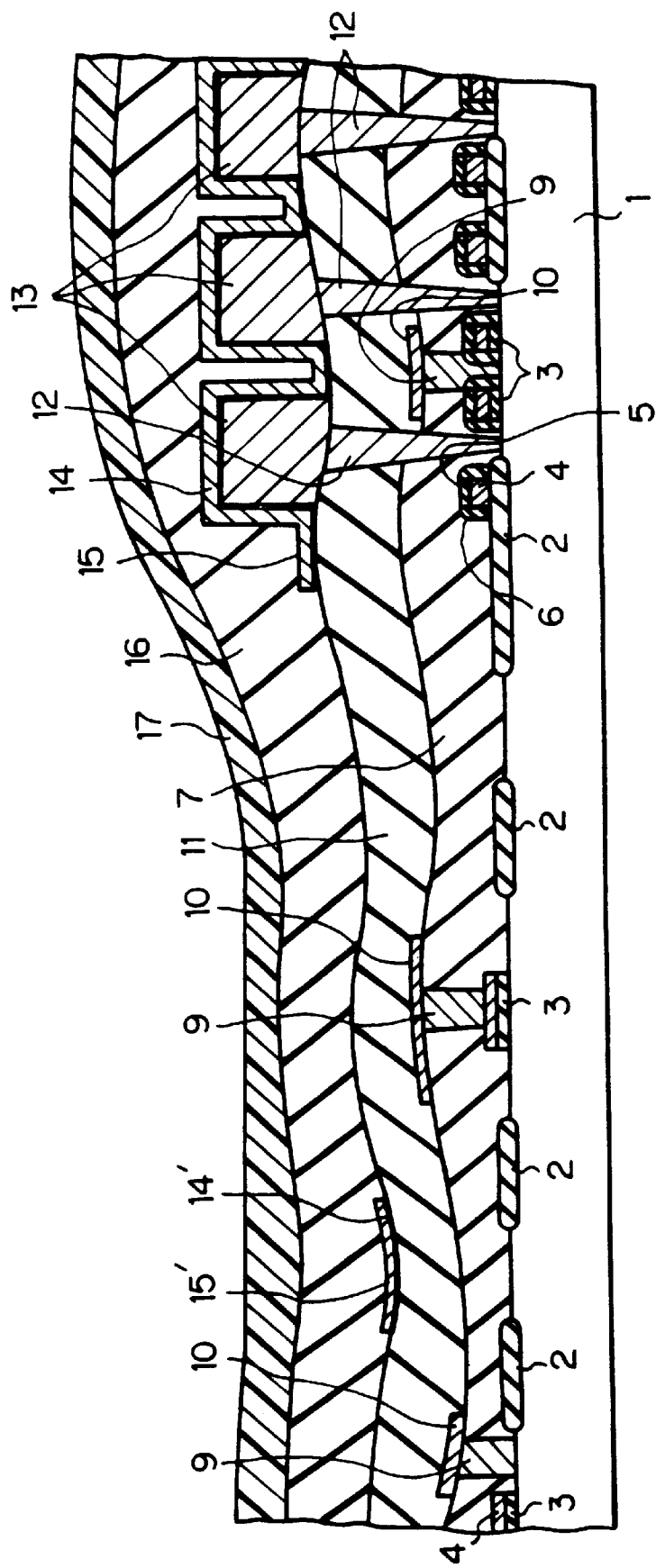

Next, referring to FIG. 6I, in the same way as in FIG. 4I, an insulating layer 16 made of silicon oxide is deposited on the entire surface, and then, SOG solution is spin-coated on the insulating layer 16, to form an SOG layer 17 thereon.

Next, referring to FIG. 6J, in the same way as in FIG. 4J, the SOG layer 17 as well as the insulating layer 16 is etched back to flatten the insulating layer 16. In this case, since the surface of the insulating layer 16 above the dummy capacitor upper electrode layer 15' is already smooth, there is no residual layer of the SOG layer 17 as indicated by Z in FIG. 6J.

Figure 6K:
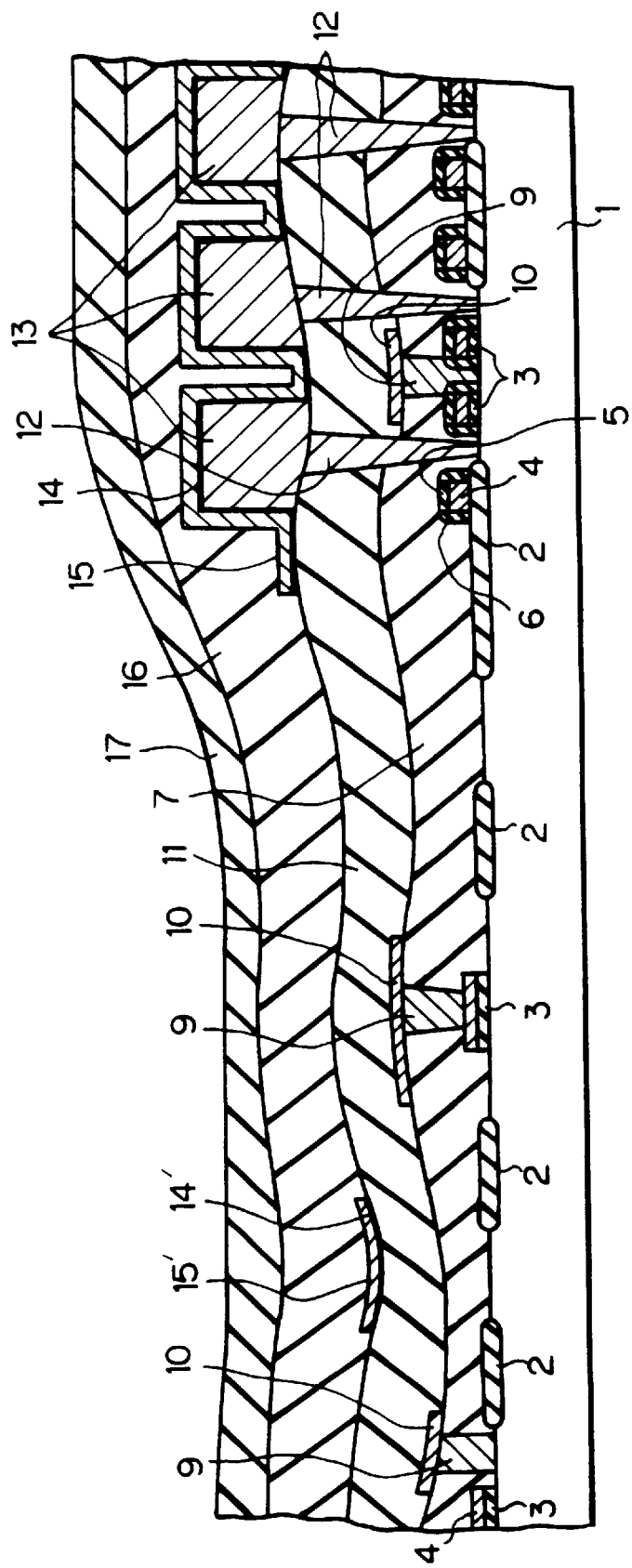

Next, referring to FIG. 6K, in the same way as in FIG. 4K, an insulating layer 17 made of silicon oxide or the like is deposited on the entire surface.

Figure 6L:
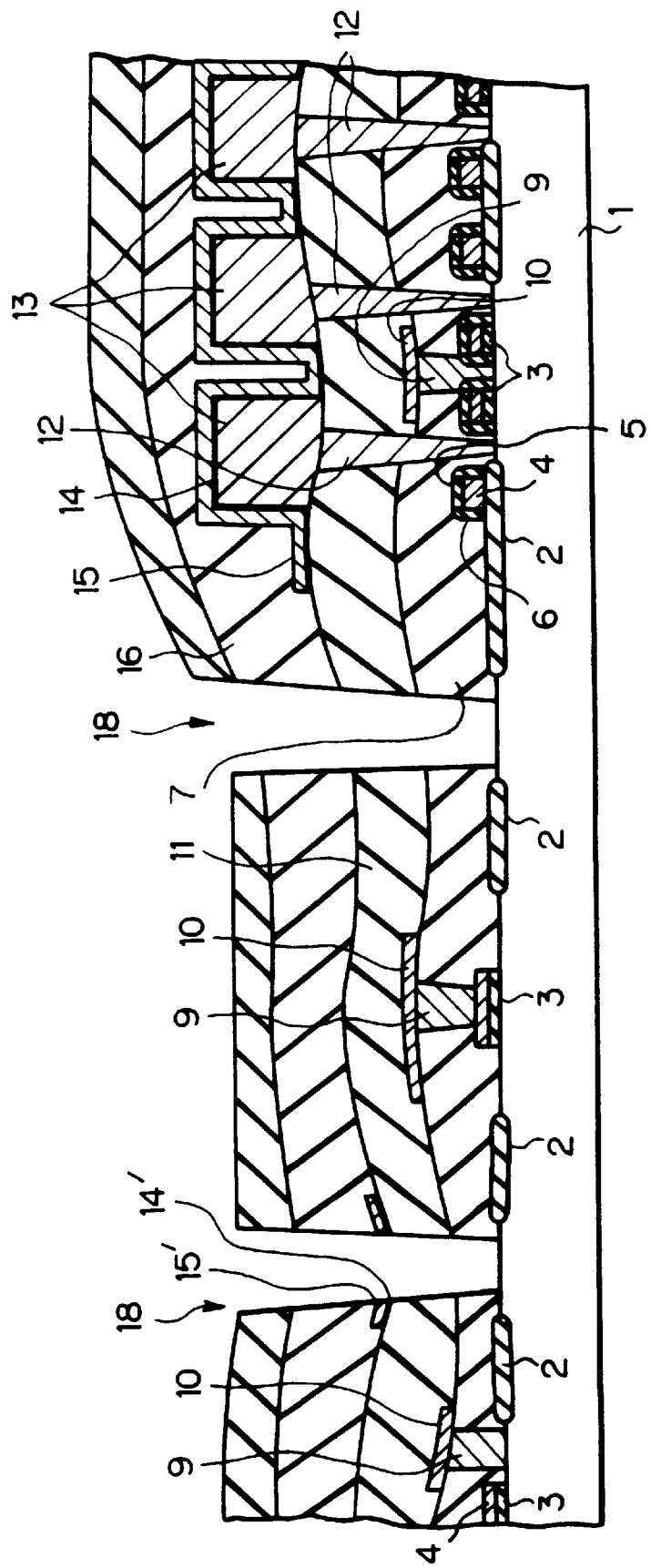

Next, referring to FIG. 6L, in a similar way to that of FIG. 4L, contact holes 18 are perforated in the insulating layers 17, 16, 11 and 7 and the dummy capacitor upper electrode layer 15' and the dummy capacitor insulating layer 14'. In this case, since the SOG layer 17 is completely removed, the SOG layer is never exposed in the contact holes 18.

Figure 6M:
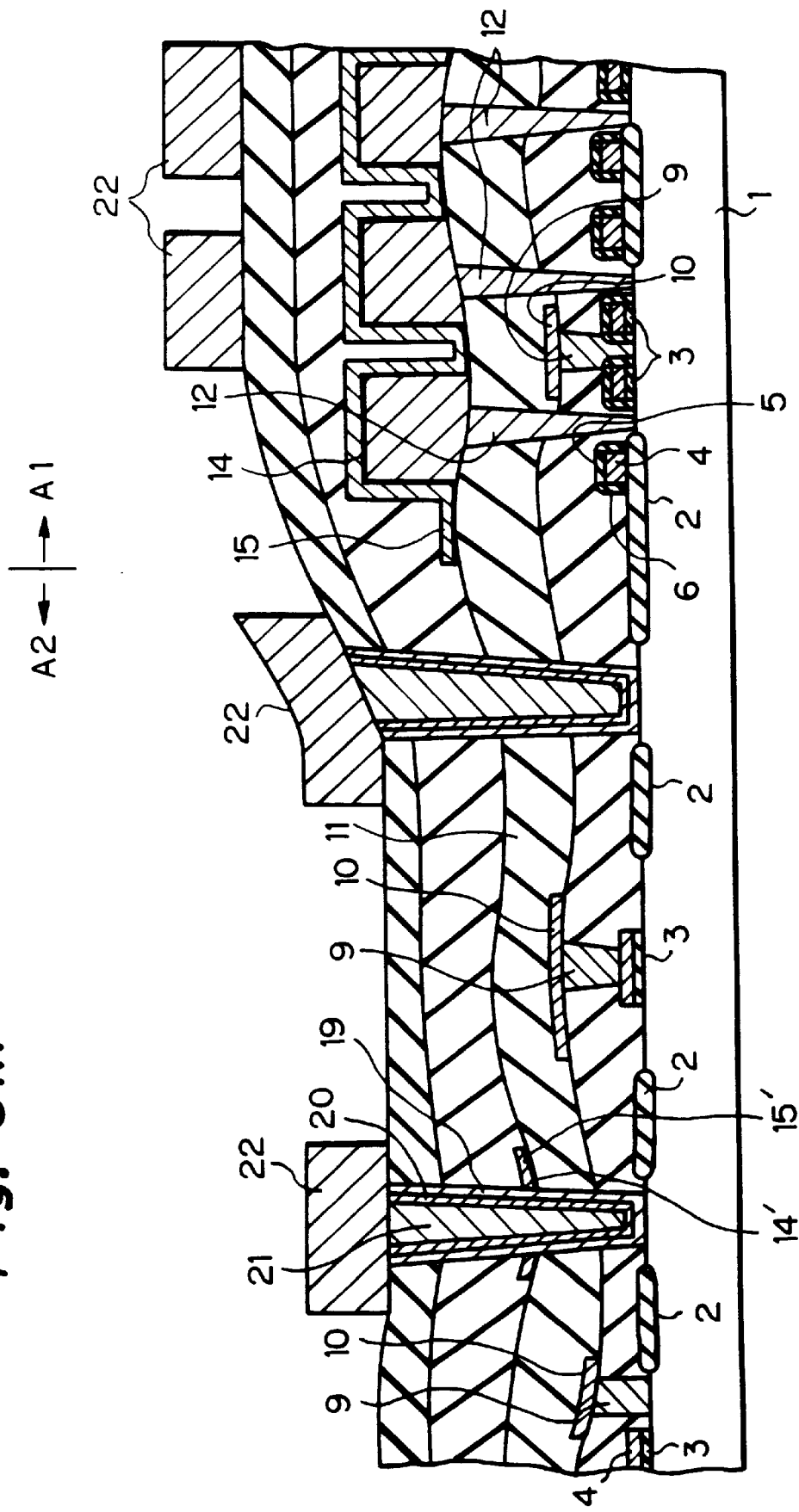

Finally, referring to FIG. 6M, in the same way as in FIG. 4M, a titanium layer 19, a titanium nitride layer 20 and a tungsten layer 21 are deposited and etched back, so that the layers 19, 20 and 21 are buried in the contact holes 18. Further, an aluminum layer 22 is deposited and patterned, thus completing the semiconductor device.

FIGS. 7A through 7F are cross-sectional views for explaining a third embodiment of the method for manufacturing a DRAM device according to the present invention. Also, in FIGS. 7A through 7F, A1 designates a cell forming area, and A2 designates a peripheral circuit forming area.

In the third embodiment, first, the manufacturing steps of FIGS. 6A through 6G of the second embodiment are carried out.

Figure 7A:
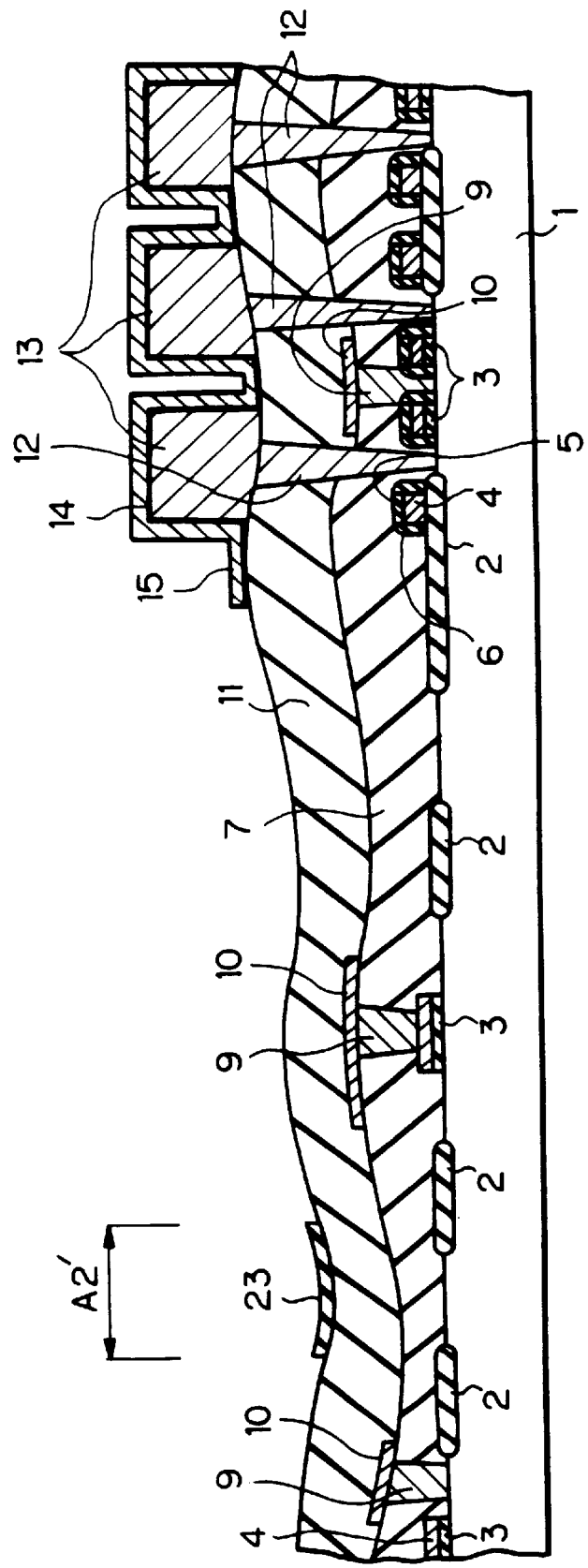
Figure 7C:
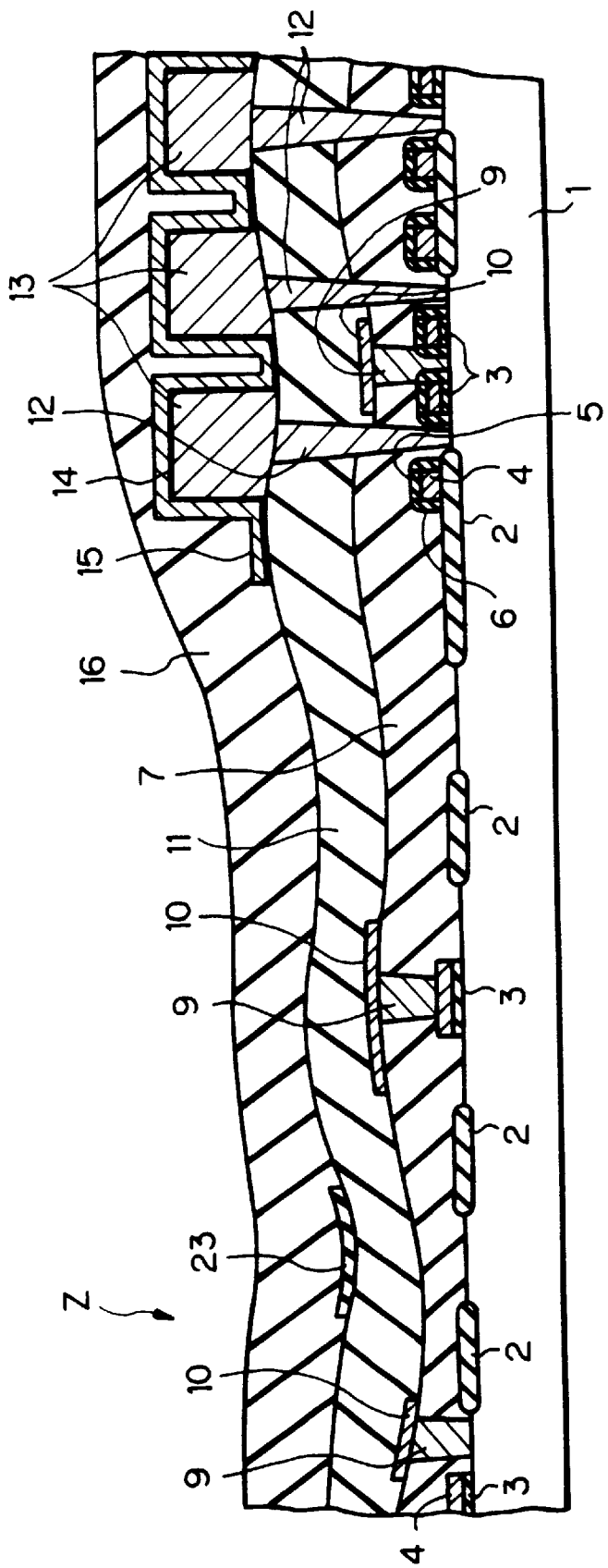
Figure 7D:
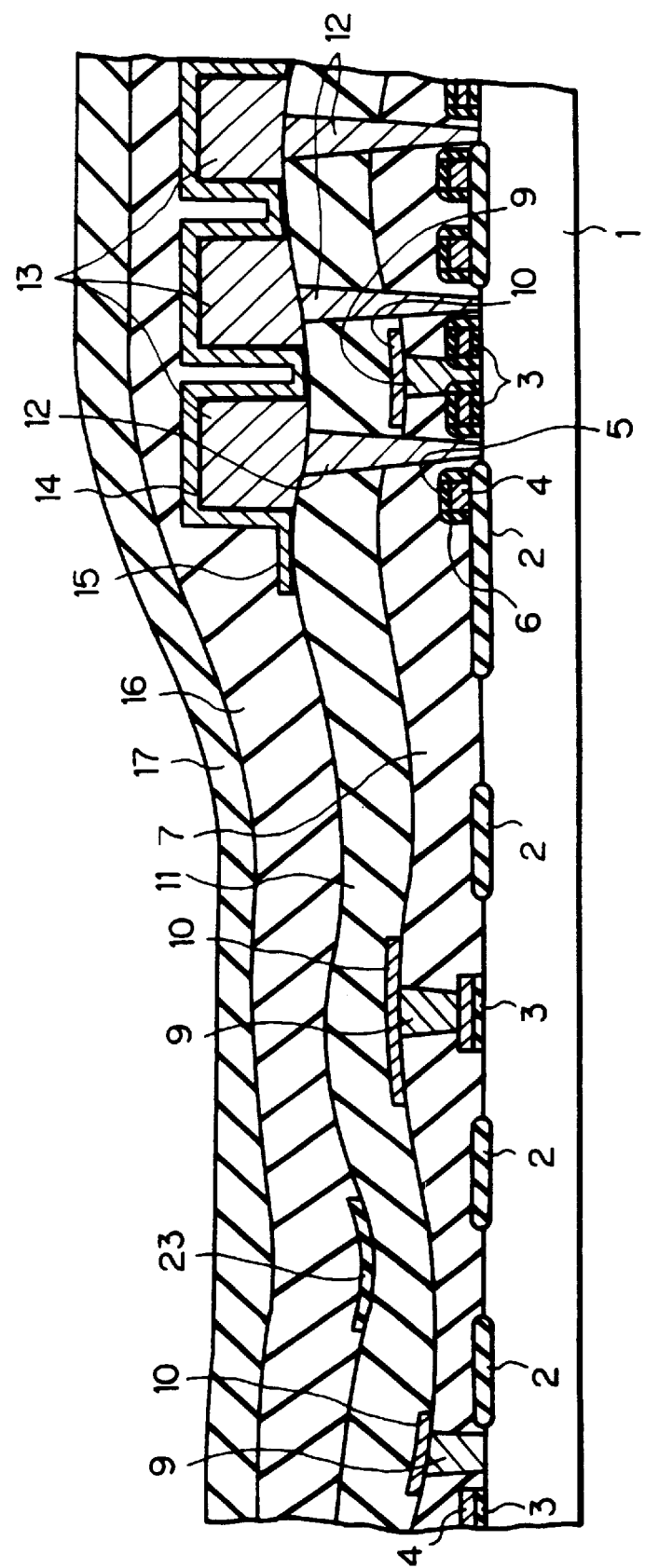
Figure 7E:
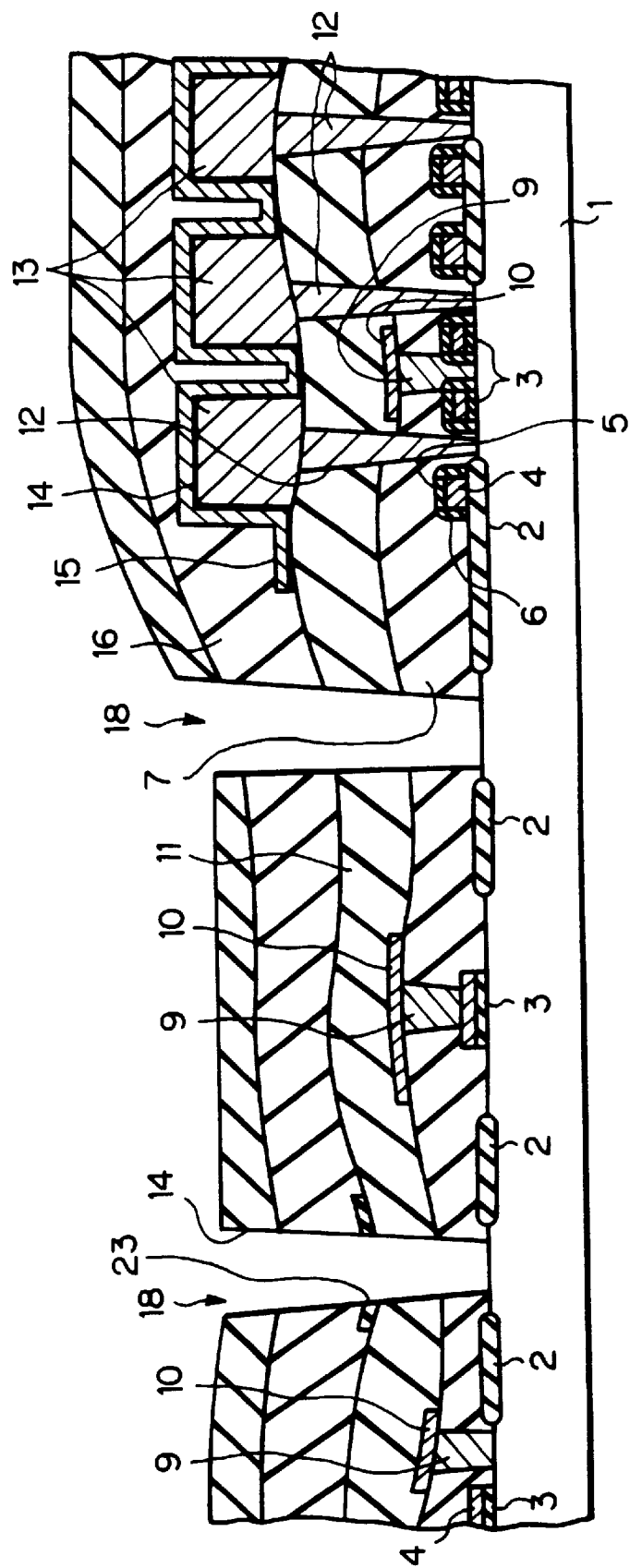
Figure 7F:
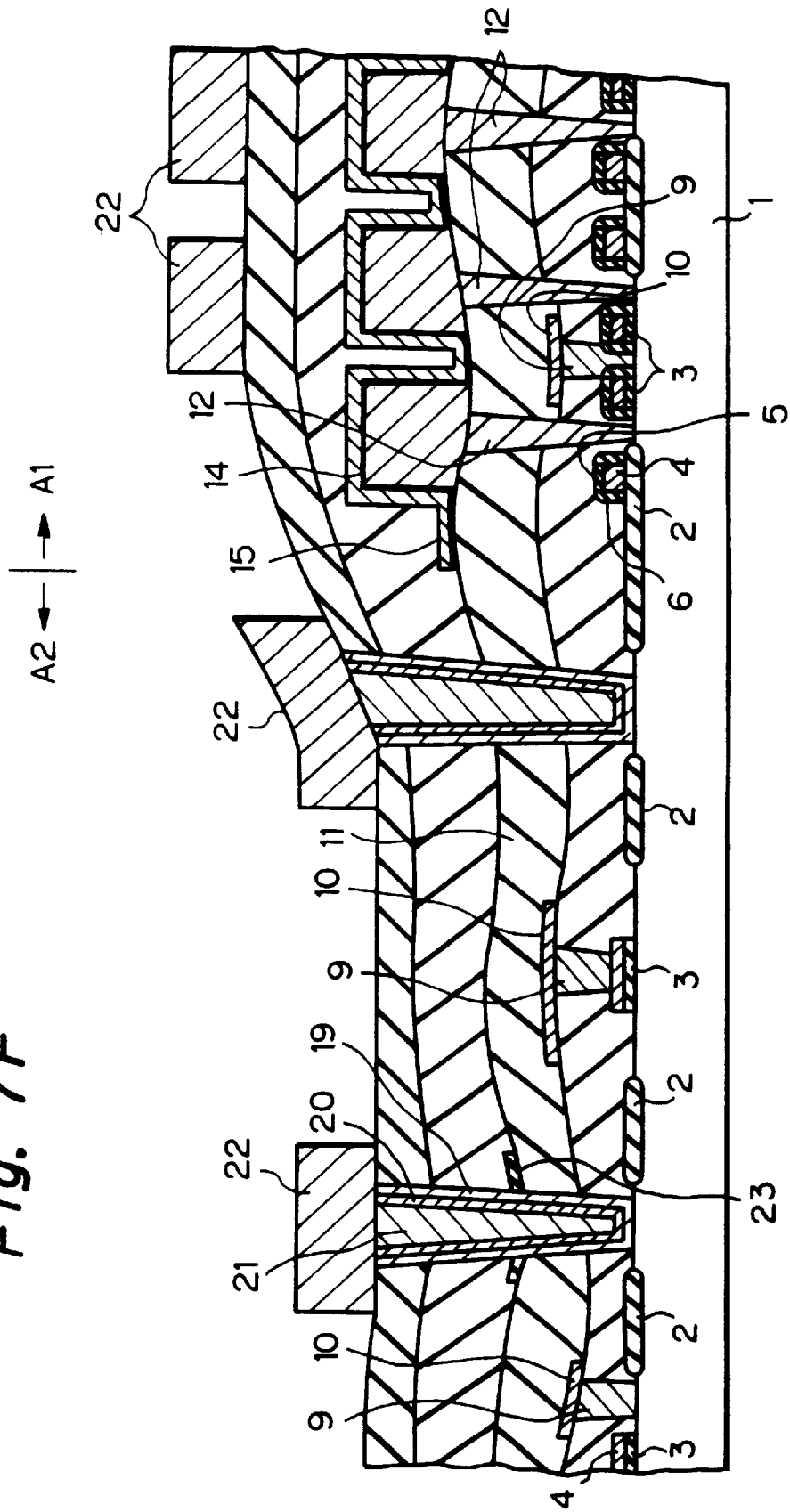

Next, referring to FIG. 7A, after the capacitor insulating layer 14 and the capacitor 15 are formed in the cell forming area A1, a silicon oxide layer (not shown) is deposited on the entire surface by a CVD process. Then, the silicon oxide layer is patterned by a photolithography and etching process, so that a dummy silicon oxide layer 23 is formed in a portion A2' of the peripheral circuit forming area A2 where a contact hole will be formed. In this case, the insulating layer 11 is also etched more or less, which, however, creates no problem.

The dummy silicon oxide layer 23 serves as the dummy capacitor upper electrode layer 15' and the capacitor insulating layer 14' of the second embodiment.

Thereafter, as illustrated in FIGS. 7B through 7F, the same manufacturing steps of FIGS. 6I through 6M of the second embodiment are carried out.

In the above-described third embodiment, although the dummy silicon oxide layer 23 is formed on the insulating layer 11, the dummy silicon oxide layer 23 can be formed on the insulating layer 7 or the silicon substrate 1. Also, the dummy layer 23 can be made of other materials such as silicon nitride.

Also, the above-described embodiments can be applied to devices other than the DRAM device.

As explained hereinabove, according to the present invention, when a first layer is flattened by using a SOG layer, a dummy pattern layer is formed on a portion of a second layer below the first layer where a contact hole will be formed. As a result, the first layer above the dummy pattern layer becomes smooth, and therefore, when the SOG layer is etched back, the SOG layer is completely removed. Therefore, the SOG layer is never exposed in the contact hole. Thus, water of the SOG layer hardly reacts with a contact structure buried in the contact hole, which increases the reliability of the contact structure.

Also, since the dummy pattern layer can be manufactured simultaneously with other layers an additional manufacturing step is unnecessary, which can reduce the manufacturing cost.

What is claimed is:

1. A semiconductor device comprising:
   a semiconductor substrate;
   a dummy pattern layer formed directly on top of said semiconductor substrate;
   at least one first insulating layer on top of said first dummy pattern layer and said semiconductor substrate, said first insulating layer being flattened by using a spin on glass (SOG) coating and etching process;
   at least one second layer on said first insulating layer; and
   a conductive layer buried in a contact hole perforated in said second and first insulating layers and said dummy pattern layer.

2. The device as set forth in claim 1, wherein said dummy pattern layer is made of insulating material.

3. The device as set forth in claim 1, wherein said dummy pattern layer is made of conductive material.

4. A semiconductor device comprising:
   a semiconductor substrate;
   at least one first insulating layer formed on said semiconductor substrate;
   a dummy pattern layer formed on top of said first insulating layer;
   at least one second insulating layer on top of said first dummy pattern layer and said first insulating layer, said second insulating layer being flattened by using a spin on glass (SOG) coating and etching process;
   at least one third insulating layer on said second insulating layer; and
   a conductive layer buried in a contact hole perforated in said third, second and first insulating layers and said dummy pattern layer.

5. The device as set forth in claim 4, wherein said dummy pattern layer is made of insulating material.

6. The device as set forth in claim 4, wherein said dummy pattern layer is made of conductive material.

7. A semiconductor device comprising:
   a semiconductor substrate;
   a gate electrode formed over said semiconductor substrate;
   an etching stopper formed on said gate electrode;
   a dummy pattern layer formed on said semiconductor substrate;
   at least one first insulating layer formed on said etching layer and said dummy pattern layer;
   a capacitor lower electrode layer buried in a contact hole perforated in said first insulating layer;
   a capacitor insulating layer formed on said capacitor lower electrode layer;
   a capacitor upper electrode layer formed on said capacitor insulating layer;
   at least one second insulating layer formed on said capacitor upper electrode layer and said first insulating layer, said second insulating layer being flattened by using a spin on glass (SOG) coating and etching process;

at least one third insulating layer formed on said second insulating layer; and a conductive layer buried in a contact hole perforated in said third, second and first insulating layers and said dummy pattern layer.

8. The device as set forth in claim 7, wherein said dummy pattern layer is made of the same material as said etching stopper.

9. A semiconductor device comprising:

a semiconductor substrate;

at least one first insulating layer formed on said semiconductor substrate;

a capacitor lower electrode layer buried in a contact hole perforated in said first insulating layer;

a capacitor insulating layer formed on said capacitor lower electrode layer;

a capacitor upper electrode layer formed on said capacitor insulating layer;

a dummy pattern layer formed on said first insulating layer;

at least one second insulating layer formed on said capacitor upper electrode layer, said dummy pattern layer and said first insulating layer, said second insulating layer being flattened by using a spin on glass (SOG) coating and etching process;

at least one third insulating layer formed on said second insulating layer; and a conductive layer buried in a contact hole perforated in said third, second and first insulating layers and said dummy pattern layer.

10. The device as set forth in claim 9, wherein said dummy pattern layer is made of the same material as said capacitor insulating layer and said capacitor upper electrode layer.

* * * * *